(12) United States Patent
Ozawa

(10) Patent No.: US 7,800,160 B2
(45) Date of Patent: Sep. 21, 2010

(54) SEMICONDUCTOR DEVICE WITH A NITRIDE FILM BETWEEN A PAIR OF OXIDE FILMS

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 11/937,024

(22) Filed: Nov. 8, 2007

(65) Prior Publication Data

US 2008/0296656 A1  Dec. 4, 2008

(30) Foreign Application Priority Data

Nov. 9, 2006  (JP) .............................. 2006-304364

(51) Int. Cl.
  *H01L 29/788*  (2006.01)
(52) U.S. Cl. ................ 257/316; 257/324; 257/E29.132
(58) Field of Classification Search ................. 257/316, 257/321, 324, E29.129, E29.132, E29.3
  See application file for complete search history.

(56) References Cited

U.S. PATENT DOCUMENTS 6,525,400 B2 * 2/2003 Fujii et al. .................. 257/538

2006/0240619 A1   10/2006 Ozawa et al.
2006/0270186 A1 * 11/2006 Tsunomura et al. ......... 438/439
2007/0241389 A1   10/2007 Ozawa et al.

FOREIGN PATENT DOCUMENTS

JP  2002-353343  12/2002

* cited by examiner

*Primary Examiner*—Minh-Loan T Tran
*Assistant Examiner*—W. Wendy Kuo
(74) *Attorney, Agent, or Firm*—Finnegan, Henderson, Farabow, Garrett & Dunner, L.L.P.

(57) ABSTRACT

A semiconductor device includes a tunnel insulation film formed on a semiconductor substrate, a floating gate electrode formed on the tunnel insulation film, an inter-electrode insulation film formed on the floating gate electrode, a control gate electrode formed on the inter-electrode insulation film, a pair of oxide films which are formed between the tunnel insulation film and the floating gate electrode and are formed near lower end portions of a pair of side surfaces of the floating gate electrode, which are parallel in one of a channel width direction and a channel length direction, and a nitride film which is formed between the tunnel insulation film and the floating gate electrode and is formed between the pair of oxide films.

13 Claims, 19 Drawing Sheets

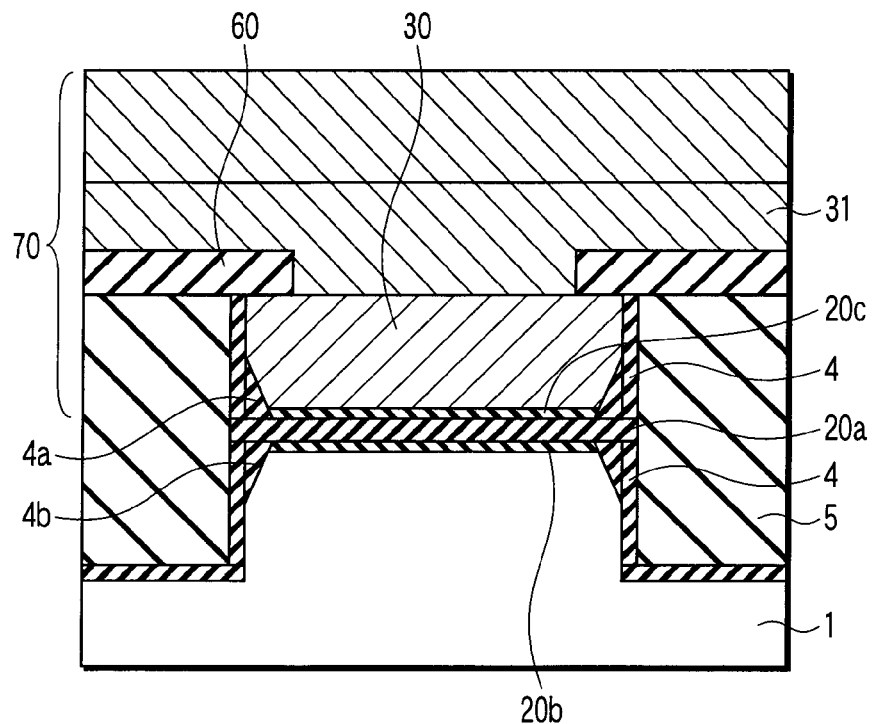
F I G. 11
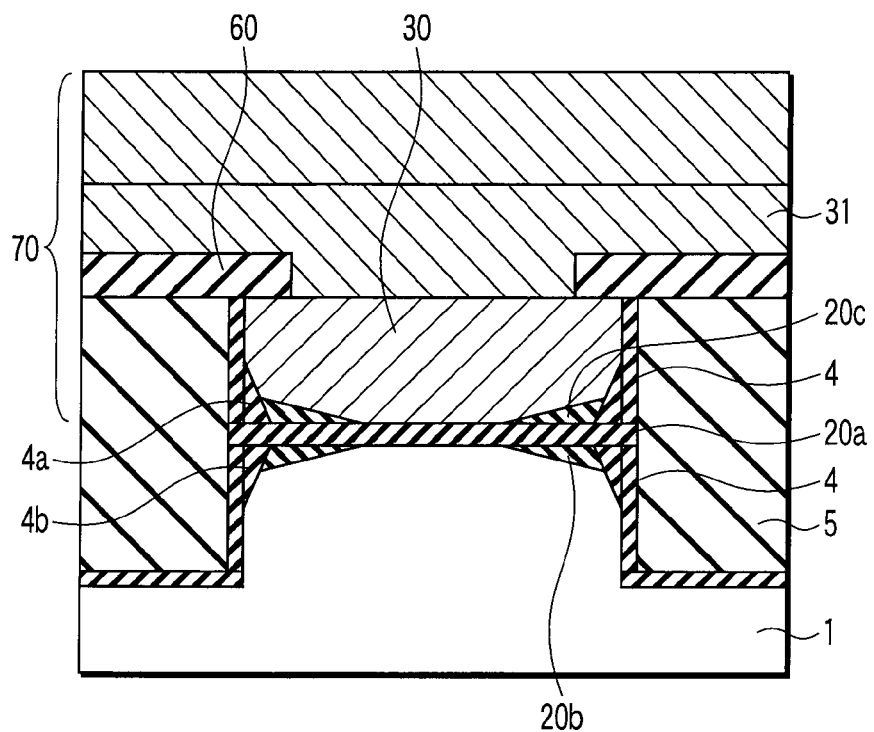
F I G. 12

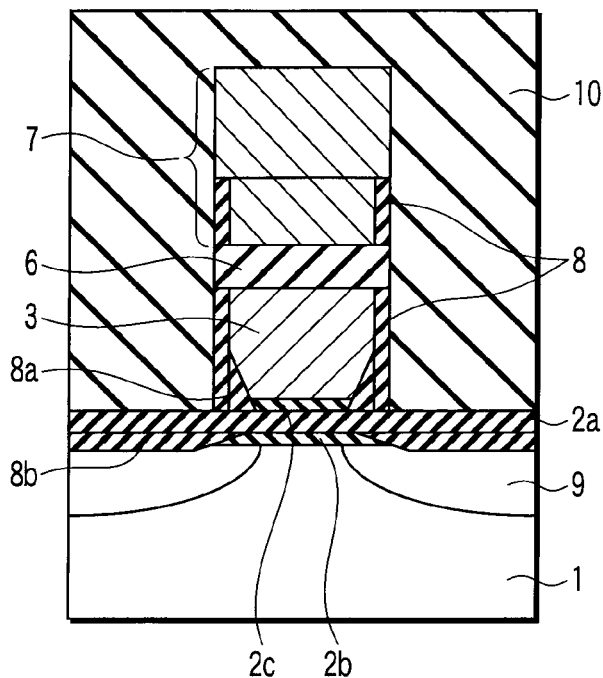
F I G. 14A
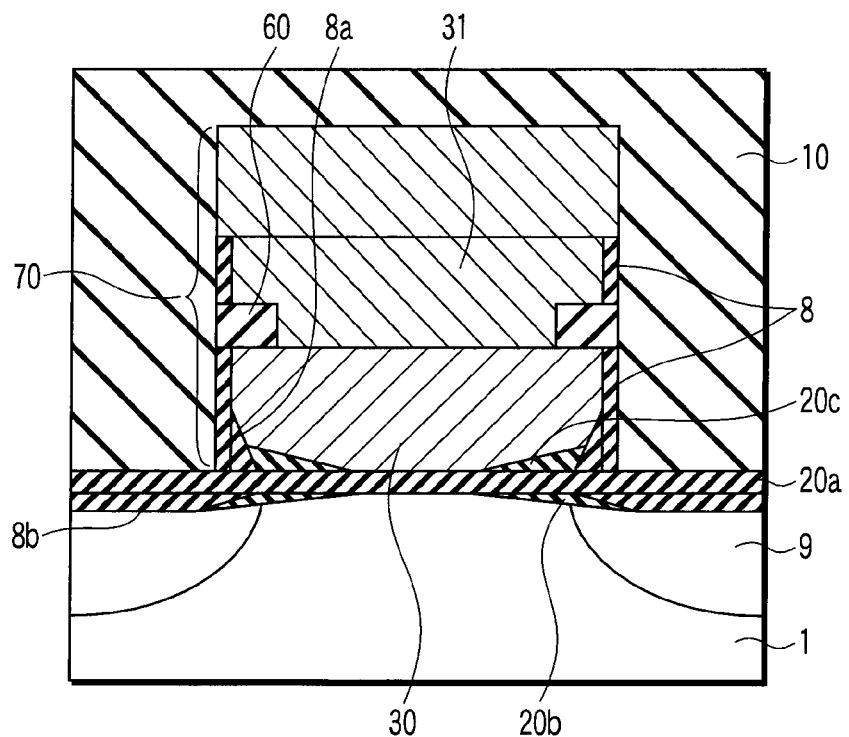
F I G. 14B

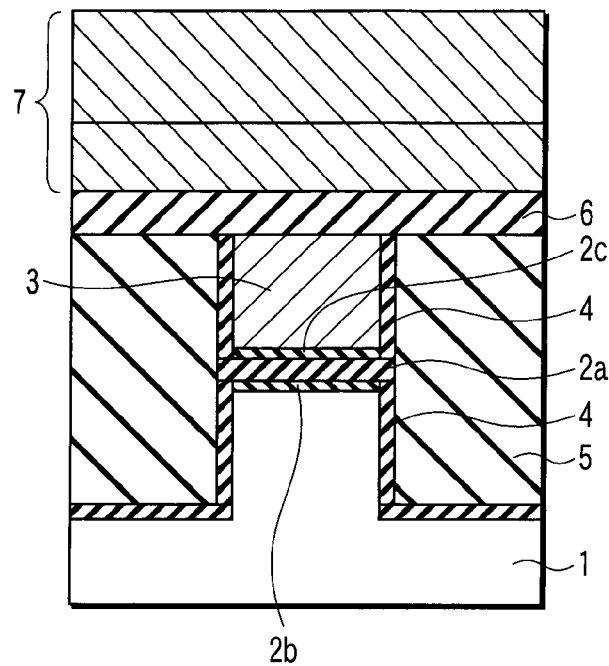
F I G. 16A
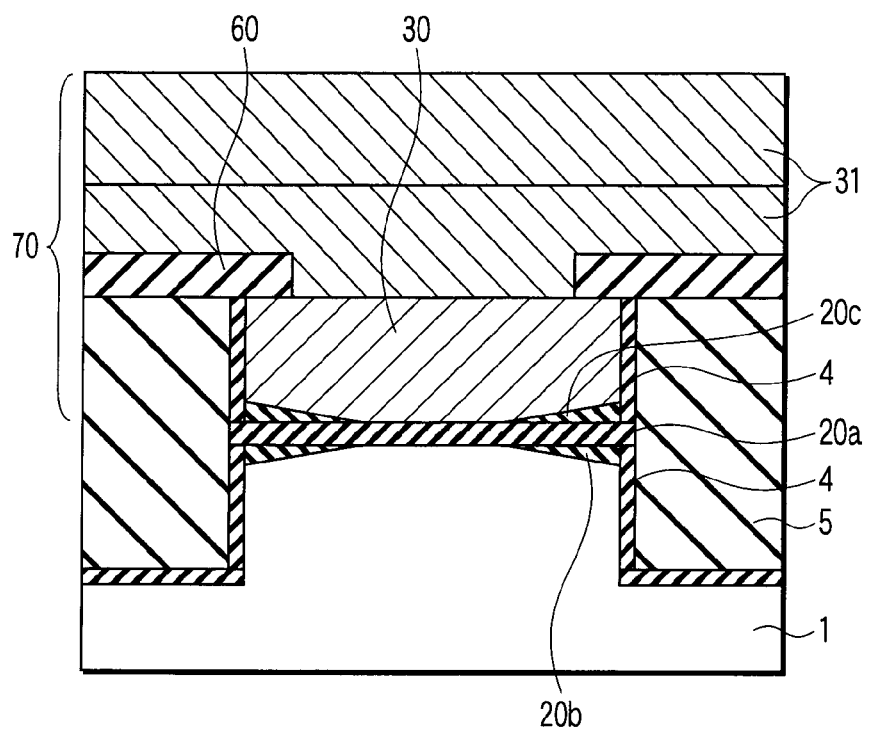
F I G. 16B

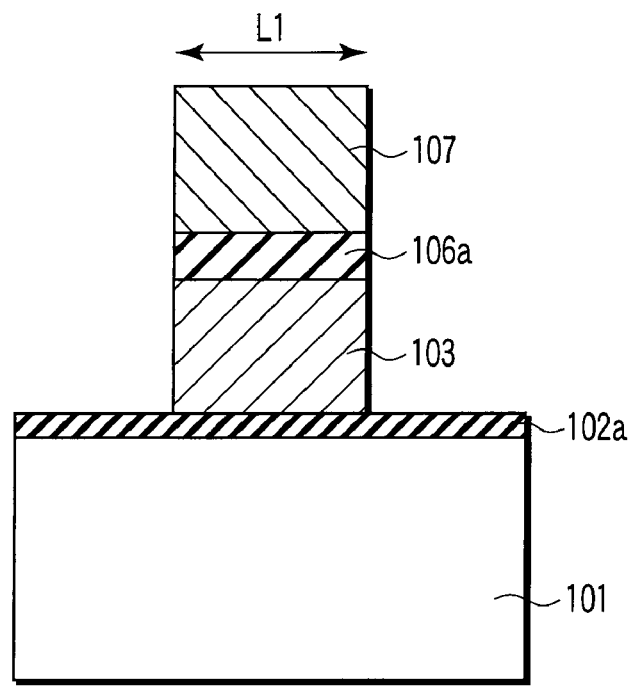
F I G. 19A
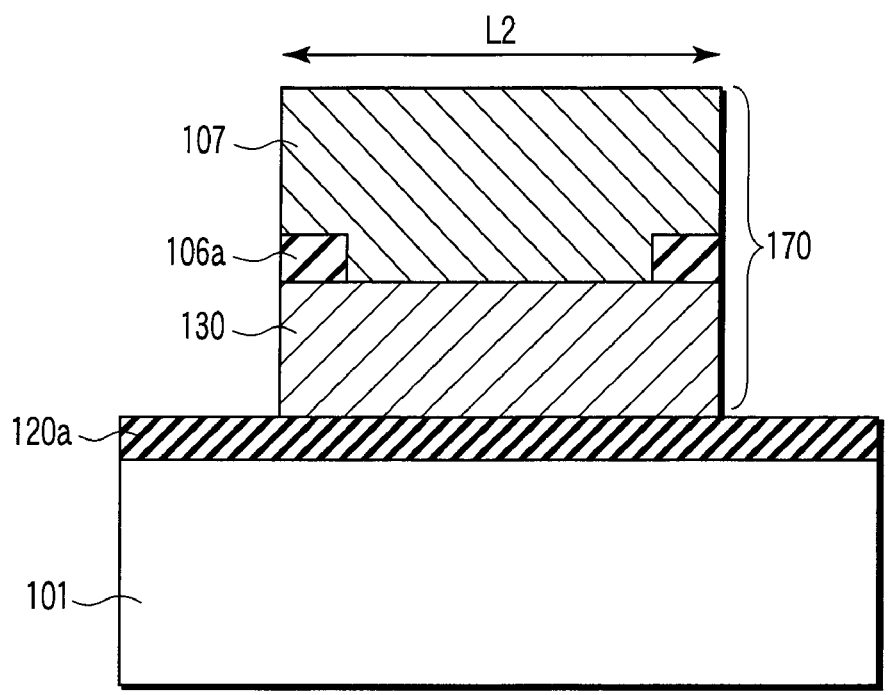
F I G. 19B

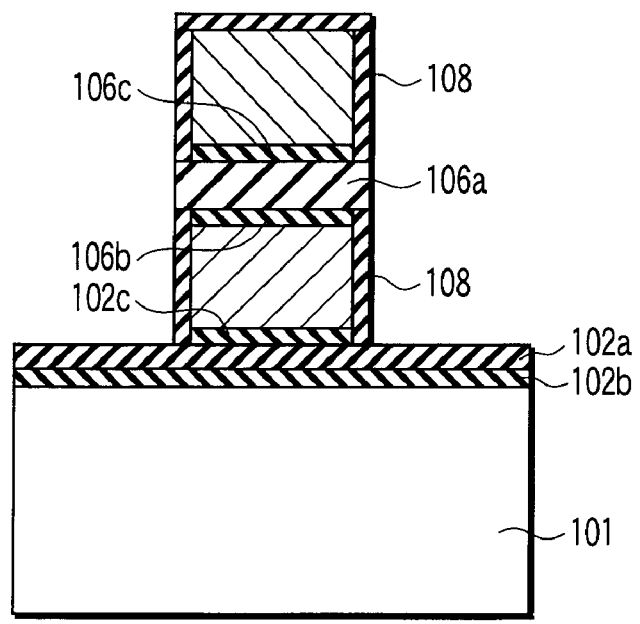
F I G. 21A
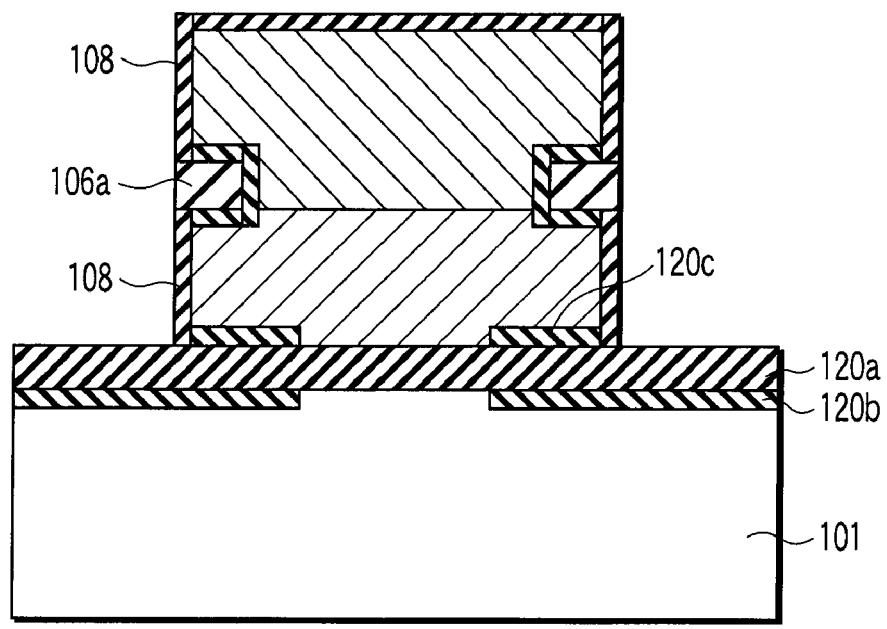
F I G. 21B

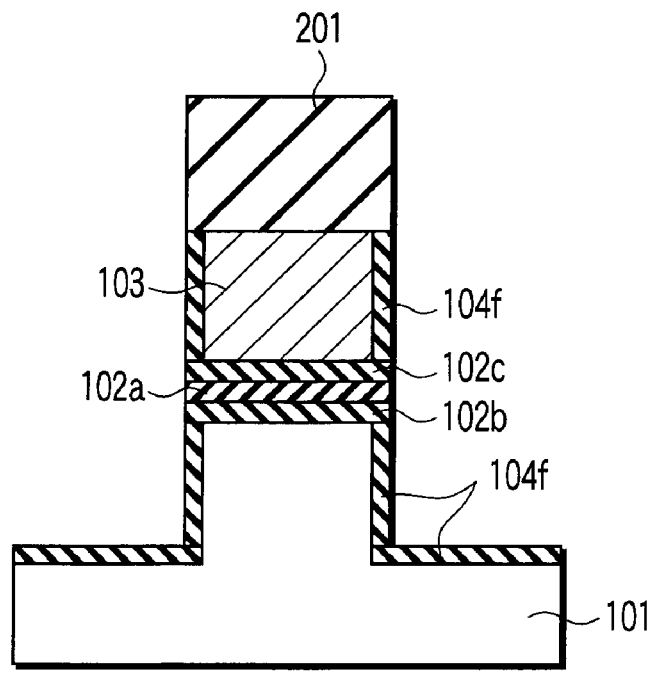
F I G. 26A
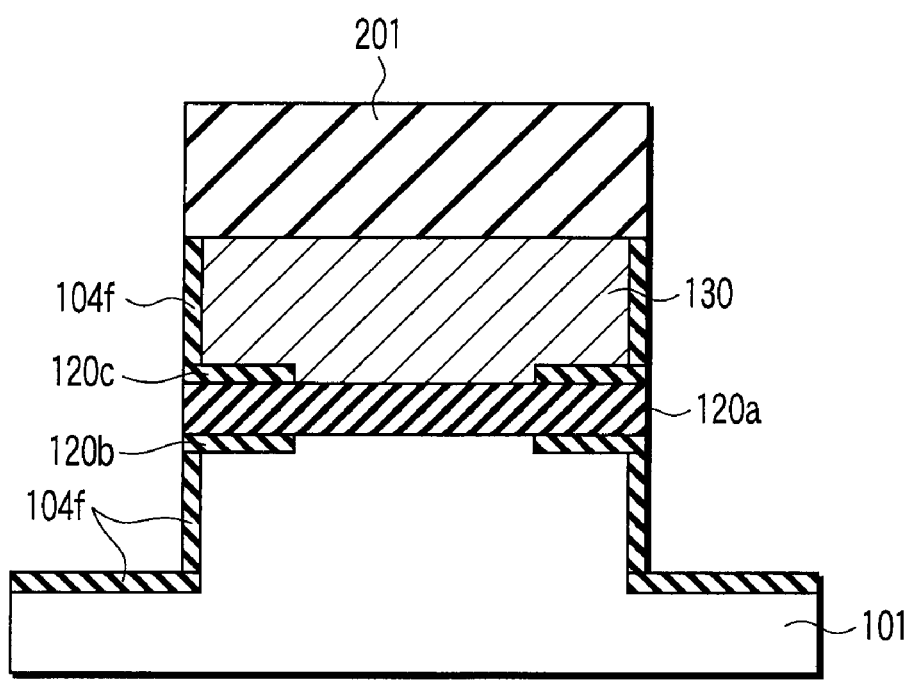
F I G. 26B

SEMICONDUCTOR DEVICE WITH A NITRIDE FILM BETWEEN A PAIR OF OXIDE FILMS

CROSS-REFERENCE TO RELATED APPLICATIONS

This application is based upon and claims the benefit of priority from prior Japanese Patent Application No. 2006-304364, filed Nov. 9, 2006, the entire contents of which are incorporated herein by reference.

BACKGROUND OF THE INVENTION

1. Field of the Invention

The present invention relates to a semiconductor device.

2. Description of the Related Art

In recent years, nonvolatile memories, such as NAND flash memories, have widely been developed and manufactured. A memory cell transistor of the nonvolatile memory includes a tunnel insulation film formed on a semiconductor substrate, a floating gate electrode formed on the tunnel insulation film, an inter-electrode insulation film formed on the floating gate electrode, and a control gate electrode formed on the inter-electrode insulation film.

In normal cases, since a silicon oxide film is used for the tunnel insulation film, an oxidizing agent easily enters the tunnel insulation film during a fabrication process. As a result, so-called bird's beak oxidation occurs, leading to an increase in operation voltage of the memory cell transistor and degradation in reliability.

It is possible to suppress progress of bird's beak oxidation by providing nitride films on the upper and lower surfaces of the tunnel insulation film. Jpn. Pat. Appln. KOKAI Publication No. 2002-353343, for instance, discloses a structure in which oxinitride films are provided on the upper and lower surfaces of the tunnel insulation film. However, if nitride films are provided, charge trap density and positive fixed charge density increase, leading to degradation in characteristics and reliability.

The above-described problem may similarly occur with respect to the inter-electrode insulation film of the memory cell transistor. Furthermore, the above-described problem may similarly occur with respect to gate insulation films of a peripheral circuit transistor and a select gate transistor in a NAND flash memory.

As has been described above, in the prior art, no effective solution to the problems with the bird's beak oxidation has been proposed, and it has been difficult to obtain a semiconductor device with excellent characteristics and reliability.

BRIEF SUMMARY OF THE INVENTION

A first aspect of the present invention, there is provided a semiconductor device comprising: a tunnel insulation film formed on a semiconductor substrate; a floating gate electrode formed on the tunnel insulation film; an inter-electrode insulation film formed on the floating gate electrode; a control gate electrode formed on the inter-electrode insulation film; a pair of oxide films which are formed between the tunnel insulation film and the floating gate electrode and are formed near lower end portions of a pair of side surfaces of the floating gate electrode, which are parallel in one of a channel width direction and a channel length direction; and a nitride film which is formed between the tunnel insulation film and the floating gate electrode and is formed between the pair of oxide films.

A second aspect of the present invention, there is provided a semiconductor device comprising: a tunnel insulation film formed on a semiconductor substrate; a floating gate electrode formed on the tunnel insulation film; an inter-electrode insulation film formed on the floating gate electrode; a control gate electrode formed on the inter-electrode insulation film; a pair of first oxide films which are formed between the floating gate electrode and the inter-electrode insulation film and are formed near upper end portions of a pair of side surfaces of the floating gate electrode, which are parallel in a channel width direction; a first nitride film which is formed between the floating gate electrode and the inter-electrode insulation film and is formed between the pair of first oxide films; a pair of second oxide films which are formed between the inter-electrode insulation film and the control gate electrode and are formed near lower end portions of a pair of side surfaces of the control gate electrode, which are parallel in a channel width direction; and a second nitride film which is formed between the inter-electrode insulation film and the control gate electrode and is formed between the pair of second oxide films.

A third aspect of the present invention, there is provided a semiconductor device comprising: a gate insulation film formed on a semiconductor substrate; a gate electrode formed on the gate insulation film; a pair of oxide films which are formed between the gate insulation film and the gate electrode and are formed near lower end portions of a pair of side surfaces of the gate electrode, which are parallel in one of a channel width direction and a channel length direction; and a nitride film which is formed between the gate insulation film and the gate electrode and is formed between the pair of oxide films.

A fourth aspect of the present invention, there is provided a semiconductor device comprising: a memory cell transistor including: a tunnel insulation film formed on a semiconductor substrate; a floating gate electrode formed on the tunnel insulation film; an inter-electrode insulation film formed on the floating gate electrode; a control gate electrode formed on the inter-electrode insulation film; and a first nitride film which is formed between the tunnel insulation film and the floating gate electrode; and a peripheral circuit transistor including: a gate insulation film formed on the semiconductor substrate; a gate electrode formed on the gate insulation film; and a second nitride film which is formed between the gate insulation film and the gate electrode and includes a pair of portions which are formed near lower end portions of a pair of side surfaces of the gate electrode, which are parallel in one of a channel width direction and a channel length direction, the pair of portions being spaced apart from each other.

BRIEF DESCRIPTION OF THE SEVERAL VIEWS OF THE DRAWING

FIG. 11 is a cross-sectional view that schematically shows the structure of a semiconductor device according to a fifth embodiment of the present invention;

FIG. 12 is a cross-sectional view that schematically shows the structure of a semiconductor device according to a modification of the fifth embodiment of the invention;

FIG. 14A and FIG. 14B are cross-sectional views that schematically show the structure of a semiconductor device according to a modification of the sixth embodiment of the invention;

FIG. 16A and FIG. 16B are cross-sectional views that schematically show the structure of a semiconductor device according to a seventh embodiment of the present invention;

FIG. 19A and FIG. 19B are cross-sectional views that schematically show a fabrication step of the semiconductor device according to the eighth embodiment of the invention;

FIG. 21A and FIG. 21B are cross-sectional views that schematically show a fabrication step of the semiconductor device according to the eighth embodiment of the invention;

FIG. 26A and FIG. 26B are cross-sectional views that schematically show a fabrication step of the semiconductor device according to the ninth embodiment of the invention;

DETAILED DESCRIPTION OF THE INVENTION

Embodiments of the present invention will now be described with reference to the accompanying drawings. In the embodiments, nonvolatile memories, such as NAND flash memories, are exemplified as semiconductor devices.

Embodiment 1

Figure 1:
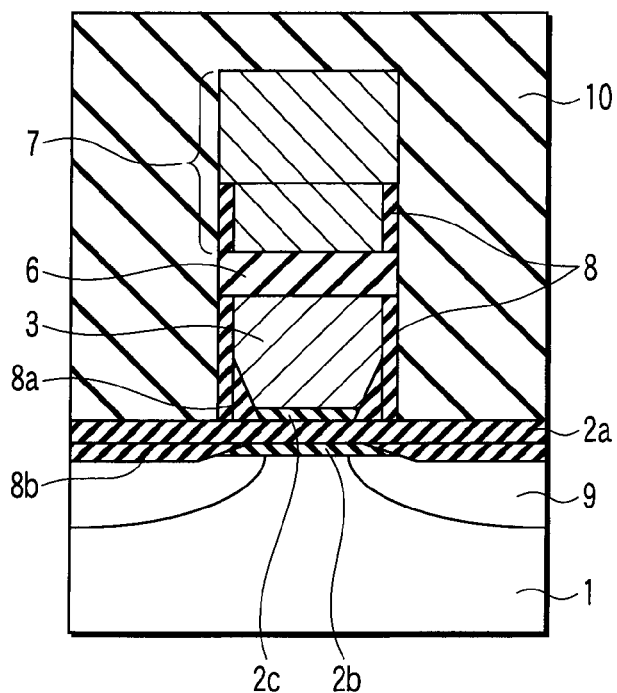
FIG. 1 is a cross-sectional view that schematically shows the structure of a semiconductor device according to a first embodiment of the present invention.

FIG. 1 is a cross-sectional view that schematically shows the structure of a semiconductor device according to a first embodiment of the present invention. Specifically, FIG. 1 is a cross-sectional view taken along a channel length direction (bit line direction) of a memory cell transistor of a nonvolatile memory.

The memory cell transistor is formed in a device formation region which is surrounded by isolation insulation films (not shown). Specifically, the memory cell transistor includes a tunnel insulation film 2a formed on a semiconductor substrate 1, a floating gate electrode 3 formed on the tunnel insulation film 2a, an inter-electrode insulation film 6 formed on the floating gate electrode 3, and a control gate electrode 7 formed on the inter-electrode insulation film 6. A pair of impurity diffusion layers 9, which become source/drain regions, are formed in a surface region of the semiconductor substrate 1. A region between the pair of impurity diffusion layers 9 becomes a channel region. Electrode sidewall oxide films 8 are formed on sidewalls of the floating gate electrode 3 and on sidewalls of the control gate electrode 7. Further, the memory cell transistor is covered with an interlayer insulation film 10.

A pair of oxide films 8a is formed on inner sides of the electrode sidewall oxide films 8. The pair of oxide films 8a are formed between the tunnel insulation film 2a and the floating gate electrode 3 and are formed near lower ends of a pair of side surfaces of the floating gate electrode 3 (i.e. a pair of side surfaces which are parallel in the channel width direction). Each of the oxide films 8a has a wedge shape with a width gradually increasing from an upper side toward a lower side.

A nitride film 2c is formed on an upper surface of the tunnel insulation film 2a. The nitride film 2c is formed between the tunnel insulation film 2a and the floating gate electrode 3, and is formed between the pair of oxide films 8a.

A pair of oxide films 8b is formed on a lower surface of the tunnel insulation film 2a. A distal end of each of the oxide films 8b is positioned on the inside of an extension plane of the interface between the electrode sidewall oxide film 8 and the floating gate electrode 3. A nitride film 2b is formed on a lower surface of the tunnel insulation film 2a. The nitride film 2b is formed between the pair of oxide films 8b.

In this description, the film 2a is referred to as "tunnel insulation film". However, a stack film of the films 2a, 2b and 2c substantially functions as the tunnel insulation film.

A silicon substrate is used as the semiconductor substrate 1, and the floating gate electrode 3 is formed of a silicon film. A lower layer portion of the control gate electrode 7 (i.e. a portion inside the electrode sidewall oxide films 8) is formed of a silicon film, and an upper layer portion of the control gate electrode 7 is formed of, e.g. a metal film.

The tunnel insulation film 2a is formed of a silicon oxide film which contains silicon and oxygen as major components. Nitrogen may be contained in the silicon oxide film. The nitride film 2b and nitride film 2c are formed of silicon nitride films which contain silicon and nitrogen as major components. Oxygen may be contained in the silicon nitride films. The nitride film 2b and nitride film 2c may be silicon oxynitride films having nitrogen concentration higher than oxygen concentration. The oxide films 8a, oxide films 8b and electrode sidewall oxide films 8 are formed of silicon oxide films which contain silicon and oxygen as major components. Nitrogen may be contained in the silicon oxide films.

As has been described above, in the present embodiment, the nitride film 2c is formed on the upper surface of the tunnel insulation film 2a, and the nitride film 2b is formed on the lower surface of the tunnel insulation film 2a. Progress of bird's beak oxidation during the fabrication process can be prevented by the nitride films 2b and 2c. Therefore, an increase of write/erase operation voltage can be suppressed, and degradation in reliability of the memory cell transistor can effectively be suppressed.

In the present embodiment, the oxide films 8a are formed at both end portions of the nitride film 2c. Specifically, in the vicinity of the lower end portions of the floating gate electrode 3, the oxide films 8a are present between the floating gate electrode 3 and the tunnel insulation film 2a, and the nitride film 2c is not present between the floating gate electrode 3 and the tunnel insulation film 2a. Thus, in the vicinity of the lower end portions of the floating gate electrode 3, there is no charge trap state due to the nitride film 2c. Therefore, at the time of the rewriting operation which makes use of a tunnel current or a hot carrier current, the charge trap amount can be reduced near the lower end portions of the floating gate electrode 3, and the reliability of the memory cell transistor can greatly be improved. Moreover, in the present embodiment, the oxide films 8b are formed at both end portions of the nitride film 2b. Thereby, the charge trap amount near the lower end portions of the floating gate electrode 3 can further be reduced, and the reliability of the memory cell transistor can greatly be improved.

Therefore, the present embodiment can provide a memory cell transistor with excellent characteristics and reliability, wherein the progress of bird's beak oxidation can be suppressed and the charge trap amount can be reduced.

Next, the outline of the fabrication process of the semiconductor device shown in FIG. 1 is described.

To begin with, a nitride film (silicon nitride film) 2b, a tunnel insulation film (silicon oxide film) 2a and a nitride film (silicon nitride film) 2c are successively formed on the surface of the semiconductor substrate 1. Subsequently, a phosphorus-doped polysilicon film is formed as a floating gate electrode film on the nitride film 2c. Then, the floating gate electrode film, nitride film 2c, tunnel insulation film 2a, nitride film 2b and semiconductor substrate 1 are patterned, thereby isolation trenches (not shown) are formed. After isolation insulation films (not shown) are formed in the isolation trenches, an inter-electrode insulation film 6 is formed. Further, a control electrode film is formed on the inter-electrode insulation film 6. Subsequently, the control electrode film, inter-electrode insulation film 6 and floating gate electrode film are patterned, thereby a control electrode 7 and a floating gate electrode 3 are formed.

Thereafter, an oxidizing process is performed in an atmosphere containing oxygen radicals. Thereby, electrode sidewall oxide films 8 are formed on side surfaces of the electrodes. In addition, by this oxidizing process, oxide films 8a and oxide films 8b are formed. The oxygen radicals can not easily enter the silicon nitride films, but can easily enter the silicon oxide films. At this time, since the oxygen radicals and silicon oxide films react easily, the length of entrance is less than in cases of ordinary oxygen gas and water vapor, and is typically 10 nm or less. Since the oxygen radicals can transform the silicon nitride film surfaces into silicon oxide films, the silicon nitride films provided on the upper and lower sides of the region, where the oxygen radicals have entered, can easily be changed into silicon oxide films by choosing proper oxidizing process conditions. As a result, the oxide films 8a and oxide films 8b, as shown in FIG. 1, can be formed.

Figure 2:
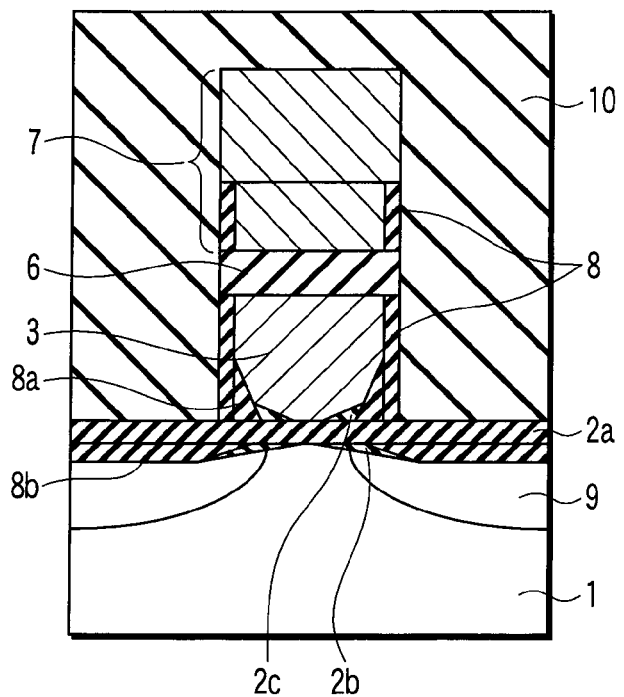
FIG. 2 is a cross-sectional view that schematically shows the structure of a semiconductor device according to a modification of the first embodiment of the invention.

FIG. 2 is a cross-sectional view that schematically shows the structure of a semiconductor device according to a modification of the first embodiment. Specifically, FIG. 2 is a cross-sectional view taken along the channel length direction (bit line direction) of the memory cell transistor of the non-volatile memory. The basic structure is the same as shown in FIG. 1. Thus, a detailed description of the parts common to those described with reference to FIG. 1 is omitted here.

In the modification shown in FIG. 2, the nitride films 2b and 2c are formed near lower end portions of the floating gate electrode 3, and are not formed near a central portion of the floating gate electrode 3. Specifically, the nitride film 2c includes a pair of portions which are formed near lower ends of a pair of side surfaces of the floating gate electrode 3 (i.e. a pair of side surfaces which are parallel in the channel width direction), and the pair of portions are spaced apart. Similarly, the nitride film 2b, like the nitride film 2c, includes a pair of portions which are spaced apart.

In this modification, too, the same advantageous effects as with the memory cell transistor shown in FIG. 1 can be obtained. In this modification, however, compared to the structure shown in FIG. 1, the effect of suppressing the bird's beak oxidation decreases. It is thus necessary to restrict process conditions, for example, to lower the process temperature in the oxidation step in the semiconductor device fabrication process. Instead, by virtue of the absence of the nitride film in the central region of the channel, scattering of carriers flowing in the cannel hardly occurs, which is considered to occur due to fixed charge that is present in the nitride film. As a result, the mobility of the carriers increases, and the on-current of the transistor can be increased. In addition, since the positive fixed charge density decreases, the threshold voltage of the transistor rises and the off-current of the transistor can be decreased.

Next, the outline of the fabrication process of the semiconductor device shown in FIG. 2 is described.

To begin with, a tunnel insulation film (silicon oxide film) 2a is formed on the surface of the semiconductor substrate 1. Subsequently, a phosphorus-doped polysilicon film is formed as a floating gate electrode film on the tunnel insulation film 2a. Then, the floating gate electrode film, tunnel insulation film 2a and semiconductor substrate 1 are patterned, thereby isolation trenches (not shown) are formed. After isolation insulation films (not shown) are formed in the isolation trenches, an inter-electrode insulation film 6 is formed. Further, a control electrode film is formed on the inter-electrode insulation film 6. Subsequently, the control electrode film, inter-electrode insulation film 6 and floating gate electrode film are patterned, thereby a control electrode 7 and a floating gate electrode 3 are formed.

Thereafter, a thermal nitriding process is performed in an atmosphere containing a nitriding gas such as nitric oxide gas, nitrous oxide gas or ammonia gas. In this thermal nitriding process, the process conditions are so set that the diffusion length of the nitriding gas in the silicon oxide film may become less than half the channel length. Thereby, the silicon nitride film 2b and silicon nitride film 2c, as shown in FIG. 2, can be formed. At the same time, silicon oxinitride films or silicon nitride films are formed on sidewalls of the electrodes. Subsequently, an oxidizing process is performed in an atmosphere containing oxygen radicals. Thereby, oxide films 8a and 8b are formed. In addition, the silicon oxinitride films or silicon nitride films formed on the electrode sidewalls are transformed into silicon oxide films, and the electrode sidewall oxide films 8 are formed.

Figure 3:
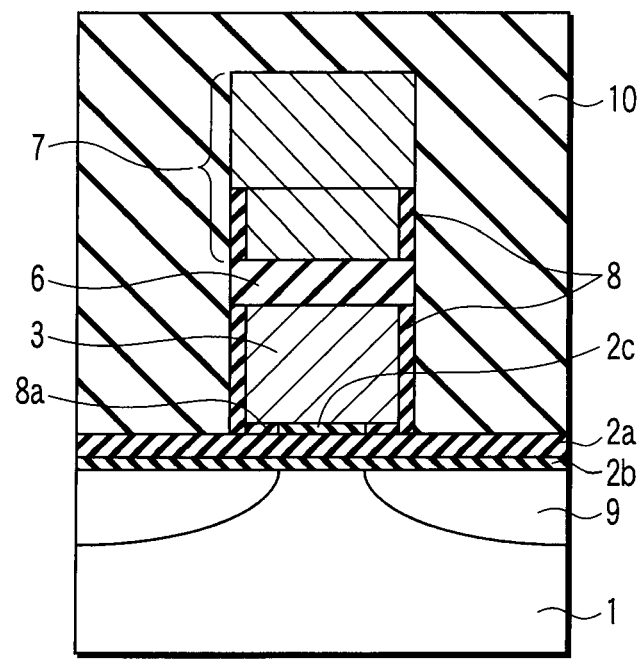
FIG. 3 is a cross-sectional view that schematically shows the structure of a semiconductor device according to another modification of the first embodiment of the invention.

FIG. 3 is a cross-sectional view that schematically shows the structure of a semiconductor device according to another modification of the first embodiment. Specifically, FIG. 3 is a cross-sectional view taken along the channel length direction (bit line direction) of the memory cell transistor of the nonvolatile memory. The basic structure is the same as shown in FIG. 1 and FIG. 2. Thus, a detailed description of the parts common to those described with reference to FIG. 1 and FIG. 2 is omitted here.

In the modification shown in FIG. 2, each of the oxide films 8a has a wedge shape. In the modification shown in FIG. 3, each of the oxide films 8a has a rectangular shape.

In this modification, too, the same advantageous effects as with the memory cell transistors shown in FIG. 1 and FIG. 2 can be obtained. In the structures shown in FIG. 1 and FIG. 2, since the angles at lower end corners of the floating gate electrode 3 are large (typically, larger than 90 degree), the concentration of electric field can be suppressed. In the structure shown in FIG. 3, since the angles at lower end corners of the floating gate electrode 3 are not large, there is a possibility that tunnel current may concentrate due to the concentration of electric field. However, since no nitride films are present at the regions where the current concentrates, a variation of the threshold voltage hardly occurs due to charge trap.

Next, the outline of the fabrication process of the semiconductor device shown in FIG. 3 is described.

To begin with, by the same method as described with reference to FIG. 1, the control electrode 7 and floating gate electrode 3 are formed. Then, using a chemical such as hot phosphoric acid, the silicon nitride film 2c is selectively etched. At this time, the silicon nitride film 2c near lower end portions of the floating gate electrode 3 can be removed by controlling the etching time and etching temperatures. Thereafter, a thermal oxidation process is performed in an atmosphere containing an oxidizing gas such as oxygen gas or water vapor. Thereby, electrode sidewall oxide films 8 are formed on side surfaces of the floating gate electrode 3 and control electrode 7. In addition, by this oxidizing process, oxide films 8a are formed near lower end portions of the floating gate electrode 3.

Embodiment 2

Figure 4:
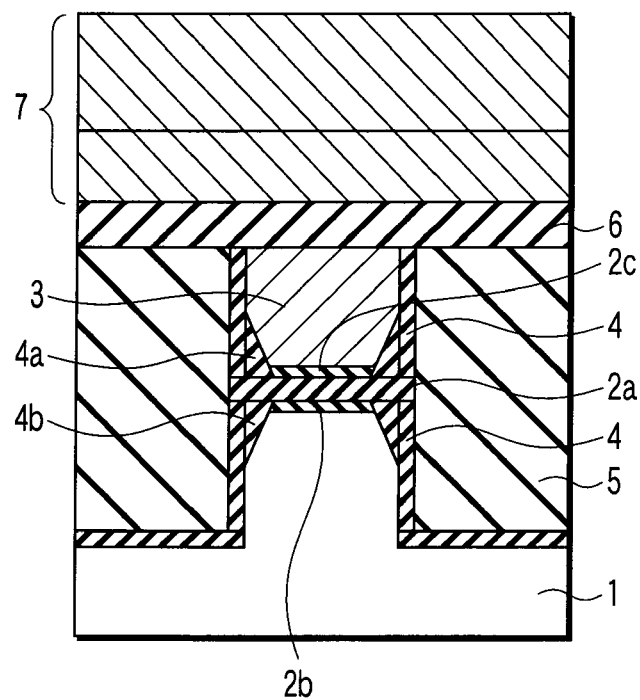
FIG. 4 is a cross-sectional view that schematically shows the structure of a semiconductor device according to a second embodiment of the present invention.

FIG. 4 is a cross-sectional view that schematically shows the structure of a semiconductor device according to a second embodiment of the invention. Specifically, FIG. 4 is a cross-sectional view taken along the channel width direction (word line direction) of a memory cell transistor of the nonvolatile memory. The basic structure is the same as shown in FIG. 1. Thus, a detailed description of the parts common to those described with reference to FIG. 1 is omitted here.

As shown in FIG. 4, the memory cell transistor is formed in a device formation region which is surrounded by isolation insulation films 5. The isolation insulation films 5 are buried in isolation trenches, and isolation trench sidewall insulation films 4 are formed on surfaces of the isolation trenches.

A pair of oxide films 4a and a pair of oxide films 4b are formed on inner sides of the isolation trench sidewall insulation films 4. The pair of oxide films 4a are formed between the tunnel insulation film 2a and floating gate electrode 3 and are formed near lower ends of a pair of side surfaces of the floating gate electrode 3 (i.e. a pair of side surfaces which are parallel in the channel length direction). Each of the oxide films 4a has a wedge shape with a width gradually increasing from an upper side toward a lower side. The pair of oxide films 4b are formed between the tunnel insulation film 2a and the device formation region of the semiconductor substrate 1, and are formed near upper ends of a pair of side surfaces of the device formation region (i.e. a pair of side surfaces which are parallel in the channel length direction). Each of the oxide films 4b has a wedge shape with a width gradually increasing from a lower side toward an upper side.

A nitride film 2c is formed on an upper surface of the tunnel insulation film 2a. The nitride film 2c is formed between the tunnel insulation film 2a and the floating gate electrode 3, and is formed between the pair of oxide films 4a. A nitride film 2b is formed on a lower surface of the tunnel insulation film 2a. The nitride film 2b is formed between the tunnel insulation film 2a and the device formation region of the semiconductor substrate 1, and is formed between the pair of oxide films 4b.

The materials of the tunnel insulation film 2a, nitride film 2b and nitride film 2c are the same as described in the first embodiment. The oxide films 4a, oxide films 4b and isolation trench sidewall insulation films 4 are formed of silicon oxide films which contain silicon and oxygen as major components. Nitrogen may be contained in the silicon oxide films.

As has been described above, in the present embodiment, the nitride film 2c is formed on the upper surface of the tunnel insulation film 2a, and the nitride film 2b is formed on the lower surface of the tunnel insulation film 2a. Progress of bird's beak oxidation during the fabrication process can be prevented by the nitride films 2b and 2c. Therefore, an increase of write/erase operation voltage can be suppressed, and degradation in reliability of the memory cell transistor can effectively be suppressed.

In addition, in the present embodiment, the oxide films 4a are formed at both end portions of the nitride film 2c. Specifically, in the vicinity of the lower end portions of the floating gate electrode 3, the oxide films 4a are present between the floating gate electrode 3 and the tunnel insulation film 2a, and the nitride film 2c is not present between the floating gate electrode 3 and the tunnel insulation film 2a. Thus, in the vicinity of the lower end portions of the floating gate electrode 3, there is no positive fixed charge or charge trap state due to the nitride film 2c. Therefore, the off-current of the memory cell transistor can be reduced and malfunction can be prevented, and the reliability of the memory cell transistor can greatly be improved. Moreover, in the present embodiment, the oxide films 4b are formed at both end portions of the nitride film 2b. Therefore, the positive fixed charge and the charge trap state can further be reduced, and the reliability of the memory cell transistor can greatly be improved.

Therefore, the present embodiment can provide a memory cell transistor with excellent characteristics and reliability, wherein the progress of bird's beak oxidation can be suppressed and the fixed charge amount can be reduced.

Next, the outline of the fabrication process of the semiconductor device shown in FIG. 4 is described.

To begin with, a nitride film (silicon nitride film) 2b, a tunnel insulation film (silicon oxide film) 2a and a nitride film (silicon nitride film) 2c are successively formed on the surface of the semiconductor substrate 1. Subsequently, a phosphorus-doped polysilicon film is formed as a floating gate electrode film on the nitride film 2c. Then, the floating gate electrode film, nitride film 2c, tunnel insulation film 2a, nitride film 2b and semiconductor substrate 1 are patterned, thereby isolation trenches are formed.

Thereafter, an oxidizing process is performed in an atmosphere containing oxygen radicals. Thereby, isolation trench sidewall oxide films 4 are formed on side surfaces of the isolation trenches. In addition, by this oxidizing process, oxide films 4a and oxide films 4b are formed. The oxygen radicals can not easily enter the silicon nitride films, but can easily enter the silicon oxide films. At this time, since the oxygen radicals and silicon oxide films react easily, the length of entrance is less than in cases of ordinary oxygen gas and water vapor, and is typically 10 nm or less. Since the oxygen radicals can transform the silicon nitride film surfaces into silicon oxide films, the silicon nitride films provided on the upper and lower sides of the region, where the oxygen radicals have entered, can easily be changed into silicon oxide films by choosing proper oxidizing process conditions. As a result, the oxide films 4a and oxide films 4b, as shown in FIG. 4, can be formed. Thereafter, isolation insulation films 5 are formed in the isolation trenches, and an inter-electrode insulation film and a control electrode film are formed. Further, the control electrode film, inter-electrode insulation film and floating gate electrode film are patterned, thereby a control electrode 7 and a floating gate electrode 3 are formed.

Figure 5:
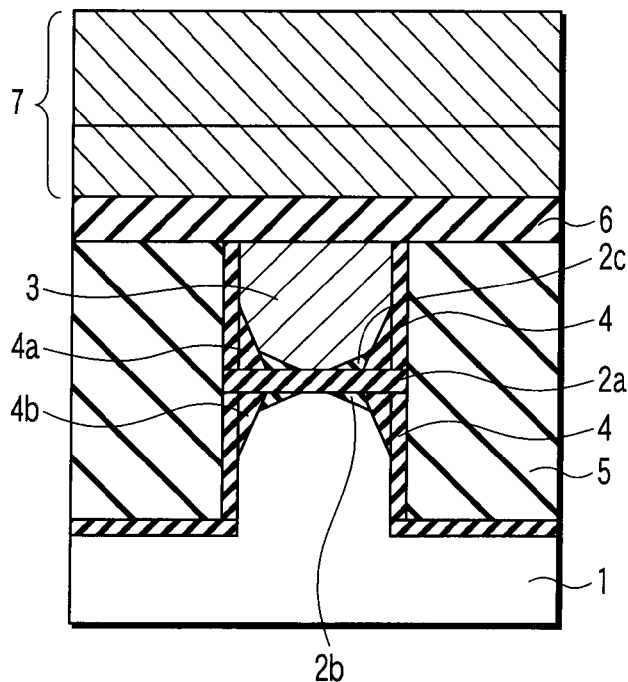
FIG. 5 is a cross-sectional view that schematically shows the structure of a semiconductor device according to a modification of the second embodiment of the invention.

FIG. 5 is a cross-sectional view that schematically shows the structure of a semiconductor device according to a modification of the second embodiment. Specifically, FIG. 5 is a cross-sectional view taken along the channel width direction (word line direction) of the memory cell transistor of the nonvolatile memory. The basic structure is the same as shown in FIG. 4. Thus, a detailed description of the parts common to those described with reference to FIG. 4 is omitted here.

In the modification shown in FIG. 5, the nitride films 2b and 2c are formed near lower end portions of the floating gate electrode 3, and are not formed near a central portion of the floating gate electrode 3. Specifically, the nitride film 2c includes a pair of portions which are formed near lower ends of a pair of side surfaces of the floating gate electrode 3 (i.e. a pair of side surfaces which are parallel in the channel length direction), and the pair of portions are spaced apart. Similarly, the nitride film 2b, like the nitride film 2c, includes a pair of portions which are spaced apart.

In this modification, too, the same advantageous effects as with the memory cell transistor shown in FIG. 4 can be obtained. In this modification, however, compared to the structure shown in FIG. 4, the effect of suppressing the bird's beak oxidation decreases. It is thus necessary to restrict process conditions. Instead, by virtue of the absence of the nitride film in the central region of the channel, scattering of carriers flowing in the channel hardly occurs. As a result, the mobility of the carriers increases, and the on-current of the transistor can be increased.

Next, the outline of the fabrication process of the semiconductor device shown in FIG. 5 is described.

To begin with, a tunnel insulation film (silicon oxide film) 2a is formed on the surface of the semiconductor substrate 1.

Subsequently, a phosphorus-doped polysilicon film is formed as a floating gate electrode film on the tunnel insulation film 2a. Then, the floating gate electrode film, tunnel insulation film 2a and semiconductor substrate 1 are patterned, thereby isolation trenches are formed.

Thereafter, a thermal nitriding process is performed in an atmosphere containing nitric oxide gas. In this thermal nitriding process, the process conditions are so set that the diffusion length of the nitric oxide gas in the silicon oxide film may become less than half the channel width. Thereby, the silicon nitride film 2b and silicon nitride film 2c, as shown in FIG. 5, can be formed. At the same time, silicon oxinitride films are formed on side surfaces of the isolation trenches. Subsequently, an oxidizing process is performed in an atmosphere containing oxygen radicals. Thereby, oxide films 4a and 4b are formed. In addition, the silicon oxinitride films which are formed on the side surfaces of the isolation trenches are transformed into silicon oxide films, and the isolation trench sidewall oxide films 4 are formed.

After isolation insulation films 5 are formed in the isolation trenches, an inter-electrode insulation film 6 is formed. Further, a control electrode film 7 is formed on the inter-electrode insulation film 6. Subsequently, the control electrode film 7, inter-electrode insulation film 6 and floating gate electrode film 3 are patterned, thereby a control electrode 7 and a floating gate electrode 3 are formed.

Figure 6:
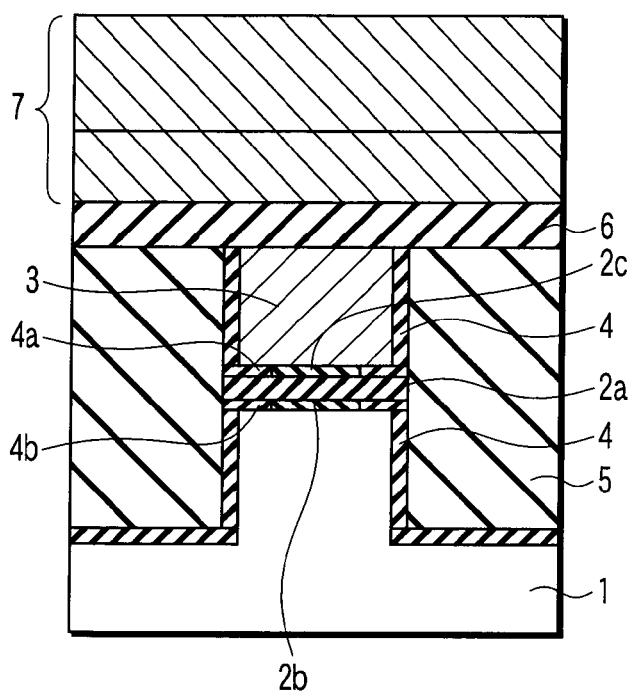
FIG. 6 is a cross-sectional view that schematically shows the structure of a semiconductor device according to another modification of the second embodiment of the invention.

FIG. 6 is a cross-sectional view that schematically shows the structure of a semiconductor device according to another modification of the second embodiment. Specifically, FIG. 6 is a cross-sectional view taken along the channel width direction (word line direction) of the memory cell transistor of the nonvolatile memory. The basic structure is the same as shown in FIG. 4 and FIG. 5. Thus, a detailed description of the parts common to those described with reference to FIG. 4 and FIG. 5 is omitted here.

In the modification shown in FIG. 5, each of the oxide films 4a and 4b has a wedge shape. In the modification shown in FIG. 6, each of the oxide films 4a and 4b has a rectangular shape.

In this modification, too, the same advantageous effects as with the memory cell transistors shown in FIG. 4 and FIG. 5 can be obtained. In the structures shown in FIG. 4 and FIG. 5, since the angles at lower end corners of the floating gate electrode 3 are large (typically, larger than 90 degree), the concentration of electric field can be suppressed. In the structure shown in FIG. 6, since the angles at lower end corners of the floating gate electrode 3 are not large, there is a possibility that the concentration of electric field may increase. However, since no nitride films are present at the regions where the electric field concentrates, an increase of off-current due to fixed charge hardly occurs.

The semiconductor device shown in FIG. 6 can be fabricated by a method similar to that shown in FIG. 3.

Embodiment 3

Figure 7:
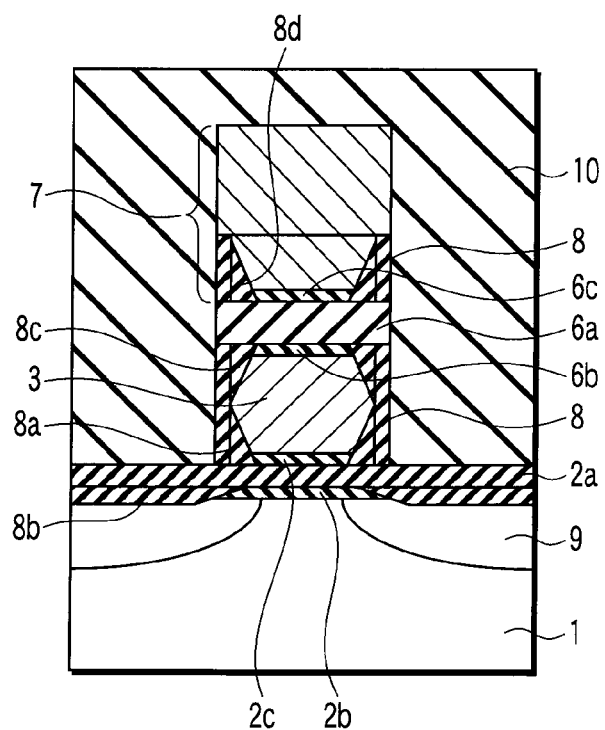
FIG. 7 is a cross-sectional view that schematically shows the structure of a semiconductor device according to a third embodiment of the present invention.

FIG. 7 is a cross-sectional view that schematically shows the structure of a semiconductor device according to a third embodiment of the present invention. Specifically, FIG. 7 is a cross-sectional view taken along a channel length direction (bit line direction) of a memory cell transistor of the nonvolatile memory. The basic structure is the same as that of the first embodiment shown in FIG. 1. Thus, a detailed description of the parts common to those described with reference to FIG. 1 is omitted here.

In the semiconductor device shown in FIG. 7, a pair of oxide films 8c is formed on inner sides of the electrode sidewall oxide films 8. The pair of oxide films 8c are formed between the floating gate electrode 3 and inter-electrode insulation film 6a, and are formed near upper ends of a pair of side surfaces of the floating gate electrode 3 (i.e. a pair of side surfaces which are parallel in the channel width direction). Each of the oxide films 8c has a wedge shape with a width gradually increasing from a lower side toward an upper side. In addition, a nitride film 6b is formed on a lower surface of the inter-electrode insulation film 6a. The nitride film 6b is formed between the floating gate electrode 3 and the inter-electrode insulation film 6a, and is formed between the pair of oxide films 8c.

Besides, in the semiconductor device shown in FIG. 7, a pair of oxide films 8d is formed on inner sides of the electrode sidewall oxide films 8. The pair of oxide films 8d are formed between the inter-electrode insulation film 6a and the control gate electrode 7, and are formed near lower ends of a pair of side surfaces of the control gate electrode 7 (i.e. a pair of side surfaces which are parallel in the channel width direction). Each of the oxide films 8d has a wedge shape with a width gradually increasing from an upper side toward a lower side. In addition, a nitride film 6c is formed on an upper surface of the inter-electrode insulation film 6a. The nitride film 6c is formed between the inter-electrode insulation film 6a and the control gate electrode 7, and is formed between the pair of oxide films 8d.

In this description, the film 6a is referred to as "inter-electrode insulation film". However, a stack film of the films 6a, 6b and 6c substantially functions as the inter-electrode insulation film.

The nitride film 6b and nitride film 6c are formed of silicon nitride films which contain silicon and nitrogen as major components. Oxygen may be contained in the silicon nitride films. The nitride film 2b and nitride film 2c may be silicon oxynitride films having nitrogen concentration higher than oxygen concentration. The oxide films 8c, oxide films 8d and electrode sidewall oxide films 8 are formed of silicon oxide films which contain silicon and oxygen as major components. Nitrogen may be contained in the silicon oxide films.

The inter-electrode insulation film 6a is formed of a silicon oxide film which contains silicon and oxygen as major components. Nitrogen may be contained in the silicon oxide film. The inter-electrode insulation film 6a may be a stack film (silicon oxide film/silicon nitride film/silicon oxide film) in which a silicon nitride film is interposed between silicon oxide films. Alternatively, the inter-electrode insulation film 6a may be a high dielectric constant oxide film such as an aluminum oxide film (alumina) or a hafnium oxide film (hafnia). In short, the inter-electrode insulation film 6a may be an oxide film or a stack film including an oxide film.

As has been described above, in the present embodiment, the nitride film 6c is formed on the upper surface of the inter-electrode insulation film 6a, and the nitride film 6b is formed on the lower surface of the inter-electrode insulation film 6a. Progress of bird's beak oxidation during the fabrication process can be prevented by the nitride films 6b and 6c. Therefore, non-uniformity in rewriting characteristics of the memory cell can be suppressed, and degradation in reliability of the memory cell transistor can effectively be suppressed.

In the present embodiment, the oxide films 8c are formed at both end portions of the nitride film 6b, and the oxide films 8d are formed at both end portions of the nitride film 6c. Specifically, in the vicinity of the upper end portions of the floating gate electrode 3, the oxide films 8c are present between the floating gate electrode 3 and the inter-electrode insulation film 6a, and the nitride film 6b is not present between the floating gate electrode 3 and the inter-electrode insulation film 6a. Similarly, in the vicinity of the lower end portions of the control gate electrode 7, the oxide films 8d are present between the control gate electrode 7 and the inter-electrode insulation film 6a, and the nitride film 6c is not present between the control gate electrode 7 and the inter-electrode insulation film 6a. Thus, in the vicinity of the end portions of the floating gate electrode 3 and control gate electrode 7, there is no charge trap state due to the nitride films 6b and 6c. Therefore, at the time of the rewriting operation of the memory cell, the charge trap amount due to leakage current flowing in the end portions of the electrodes can be reduced, and the reliability of the memory cell transistor can greatly be improved.

Therefore, the present embodiment can provide a memory cell transistor with excellent characteristics and reliability, wherein the progress of bird's beak oxidation can be suppressed and the charge trap amount can be reduced.

Next, the outline of the fabrication process of the semiconductor device shown in FIG. 7 is described.

To begin with, a nitride film (silicon nitride film) 2b, a tunnel insulation film (silicon oxide film) 2a and a nitride film (silicon nitride film) 2c are successively formed on the surface of the semiconductor substrate 1. Subsequently, a phosphorus-doped polysilicon film is formed as a floating gate electrode film on the nitride film 2c. Then, the floating gate electrode film, nitride film 2c, tunnel insulation film 2a, nitride film 2b and semiconductor substrate 1 are patterned, thereby isolation trenches (not shown) are formed. After isolation insulation films (not shown) are formed in the isolation trenches, a nitride film (silicon nitride film) 6b, an inter-electrode insulation film (silicon oxide film or alumina film) 6a and a nitride film (silicon nitride film) 6c are successively formed. Further, a control electrode film 7 is formed on the nitride film 6c. Subsequently, the control electrode film 7, nitride film 6c, inter-electrode insulation film 6a, nitride film 6b and floating gate electrode film 3 are patterned, thereby a control electrode 7 and a floating gate electrode 3 are formed.

Thereafter, an oxidizing process is performed in an atmosphere containing oxygen radicals. Thereby, electrode sidewall oxide films 8 are formed on side surfaces of the electrodes. In addition, by this oxidizing process, oxide films 8a and oxide films 8b, 8c and 8d are formed. The oxygen radicals can not easily enter the silicon nitride films, but can easily enter the oxide films such as silicon oxide films and alumina films. At this time, since the oxygen radicals and oxide films react easily, the length of entrance is less than in cases of ordinary oxygen gas and water vapor, and is typically 10 nm or less. Since the oxygen radicals can transform the silicon nitride film surfaces into silicon oxide films, the silicon nitride films provided on the upper and lower sides of the regions, where the oxygen radicals have entered, can easily be changed into silicon oxide films by choosing proper oxidizing process conditions. As a result, the oxide films 8c and oxide films 8d, as shown in FIG. 7, can be formed.

Figure 8:
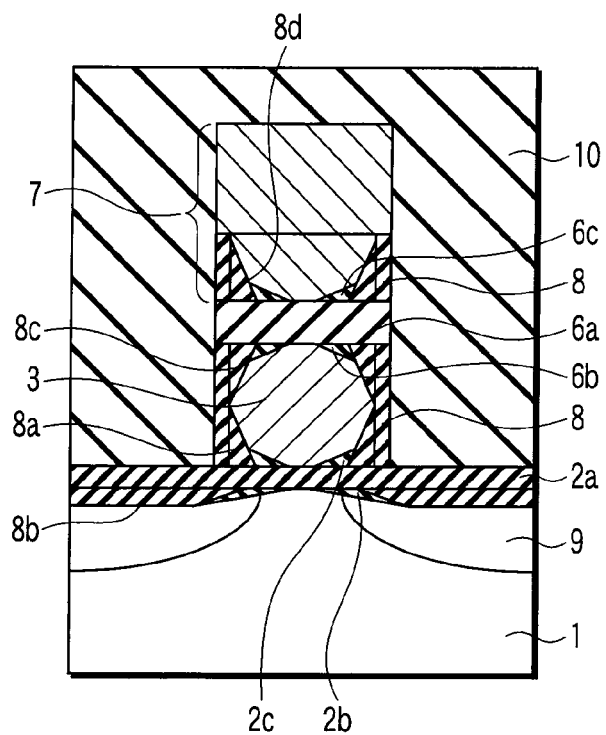
FIG. 8 is a cross-sectional view that schematically shows the structure of a semiconductor device according to a modification of the third embodiment of the invention.

FIG. 8 is a cross-sectional view that schematically shows the structure of a semiconductor device according to a modification of the third embodiment. Specifically, FIG. 8 is a cross-sectional view taken along the channel length direction (bit line direction) of the memory cell transistor of the non-volatile memory. The basic structure is the same as shown in FIG. 7. Thus, a detailed description of the parts common to those described with reference to FIG. 7 is omitted here.

In the modification shown in FIG. 8, the nitride film 6b is formed near upper end portions of the floating gate electrode 3, and is not formed near a central portion of the floating gate electrode 3. Specifically, the nitride film 6b includes a pair of portions which are formed near upper ends of a pair of side surfaces of the floating gate electrode 3 (i.e. a pair of side surfaces which are parallel in the channel width direction), and the pair of portions are spaced apart. Besides, the nitride film 6c is formed near lower end portions of the control gate electrode 7, and is not formed near a central portion of the control gate electrode 7. Specifically, the nitride film 6c includes a pair of portions which are formed near lower ends of a pair of side surfaces of the control gate electrode 7 (i.e. a pair of side surfaces which are parallel in the channel width direction), and the pair of portions are spaced apart.

In this modification, too, the same advantageous effects as with the memory cell transistor shown in FIG. 7 can be obtained. In this modification, however, compared to the structure shown in FIG. 7, the effect of suppressing the bird's beak oxidation decreases. It is thus necessary to restrict process conditions. Instead, by virtue of the absence of the nitride film in the central region of the inter-electrode insulation film 6a, the electrical capacitance of the substantial inter-electrode insulation film comprising the films 6a, 6b and 6c can be increased. Therefore, the write/erase operation voltage of the memory cell can greatly be decreased.

The semiconductor device shown in FIG. 8 can be fabricated by combining the fabrication method of FIG. 2 and the fabrication method of FIG. 7.

In the example shown in FIG. 8, each of the oxide films 8c and 8d has a wedge shape. Alternatively, like the example shown in FIG. 3, each of the oxide films 8c and 8d may be formed in a rectangular shape.

Embodiment 4

Figure 9:
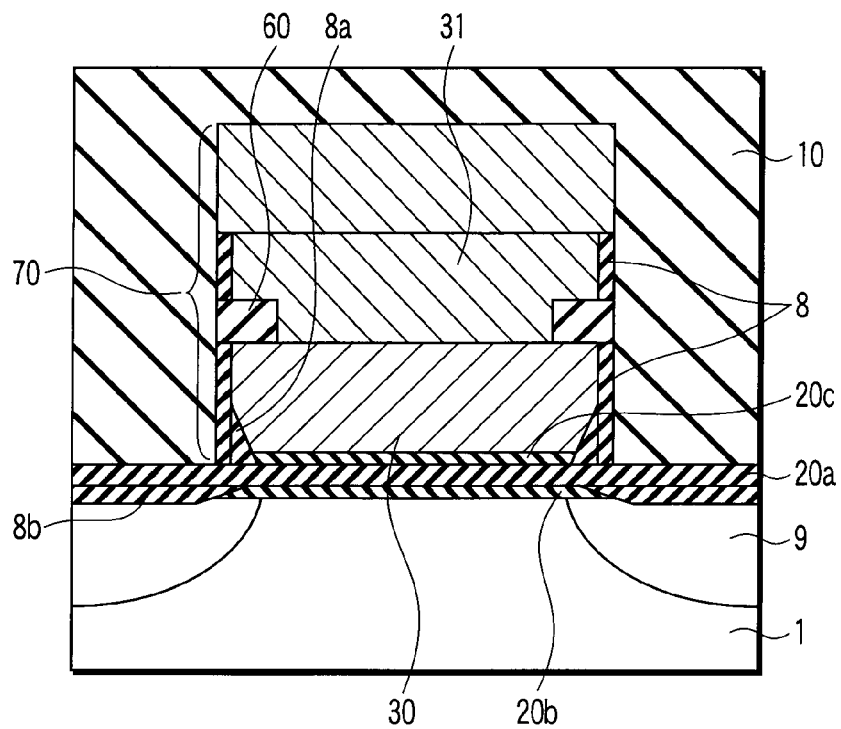
FIG. 9 is a cross-sectional view that schematically shows the structure of a semiconductor device according to a fourth embodiment of the present invention.

FIG. 9 is a cross-sectional view that schematically shows the structure of a semiconductor device according to a fourth embodiment of the present invention. Specifically, FIG. 9 is a cross-sectional view taken along a channel length direction of a peripheral circuit transistor of a nonvolatile memory. The peripheral circuit transistor in this embodiment includes select gate transistor.

The peripheral circuit transistor is formed in a device formation region which is surrounded by isolation insulation films (not shown). Specifically, the peripheral circuit transistor includes a gate insulation film 20a formed on a semiconductor substrate 1, and a gate electrode 70 formed on the gate insulation film 20a. A pair of impurity diffusion layers 9, which become source/drain regions, are formed in a surface region of the semiconductor substrate 1. A region between the pair of impurity diffusion layers 9 becomes a channel region. Electrode sidewall oxide films 8 are formed on sidewalls of the gate electrode 70. Further, the peripheral circuit transistor is covered with an interlayer insulation film 10.

A pair of oxide films 8a are formed on inner sides of the electrode sidewall oxide films 8. The pair of oxide films 8a are formed between the gate insulation film 20a and the gate electrode 70 and are formed near lower ends of a pair of side surfaces of the gate electrode 70 (i.e. a pair of side surfaces which are parallel in the channel width direction). Each of the oxide films 8a has a wedge shape with a width gradually increasing from an upper side toward a lower side.

A nitride film 20c is formed on an upper surface of the gate insulation film 20a. The nitride film 20c is formed between the gate insulation film 20a and the gate electrode 70, and is formed between the pair of oxide films 8a.

A pair of oxide films 8b are formed on a lower surface of the gate insulation film 20a. A distal end of each of the oxide films 8b is positioned on the inside of an extension plane of the interface between the electrode sidewall oxide film 8 and a lower-layer conductive portion 30 of the gate electrode 70.

A nitride film 20b is formed on a lower surface of the gate insulation film 20a. The nitride film 20b is formed between the pair of oxide films 8b.

In this description, the film 20a is referred to as "gate insulation film". However, a stack film of the films 20a, 20b and 20c substantially functions as the gate insulation film.

The structure shown in FIG. 9 is an example of the case in which the peripheral circuit transistor is formed at the same time as the memory cell transistor (e.g. the memory cell transistor shown in FIG. 1). Specifically, the lower-layer conductive portion 30 of the gate electrode 70 is formed in the same fabrication step as the floating gate electrode. Insulation portions 60 are formed in the same fabrication step as the inter-electrode insulation film. An upper-layer conductive portion 31 of the gate electrode 70 is formed in the same fabrication step as the control gate electrode.

The gate insulation film 20a is formed of a silicon oxide film which contains silicon and oxygen as major components. Nitrogen may be contained in the silicon oxide film. The nitride film 20b and nitride film 20c are formed of silicon nitride films which contain silicon and nitrogen as major components. Oxygen may be contained in the silicon nitride films. The nitride film 2b and nitride film 2c may be silicon oxynitride films having nitrogen concentration higher than oxygen concentration. The oxide films 8a, oxide films 8b and electrode sidewall oxide films 8 are formed of silicon oxide films which contain silicon and oxygen as major components. Nitrogen may be contained in the silicon oxide films.

As has been described above, in the present embodiment, the nitride film 20c is formed on the upper surface of the gate insulation film 20a, and the nitride film 20b is formed on the lower surface of the gate insulation film 20a. Progress of bird's beak oxidation during the fabrication process can be prevented by the nitride films 20b and 20c. Therefore, an increase of a threshold voltage and a decrease of the transconductance of the peripheral circuit transistor can be suppressed, and degradation of characteristics of the peripheral circuit transistor can effectively be suppressed.

In the present embodiment, the oxide films 8a are formed at both end portions of the nitride film 20c. Specifically, in the vicinity of the lower end portions of the gate electrode 70, the oxide films 8a are present between the gate electrode 70 and the gate insulation film 20a, and the nitride film 20c is not present between the gate electrode 70 and the gate insulation film 20a. Thus, in the vicinity of the lower end portions of the gate electrode 70, there is no charge trap state due to the nitride film 20c. Therefore, it is possible to reduce the charge trap amount in the vicinity of lower end portions of the gate electrode 70 due to hot carriers at the time of the transistor operation, and to greatly increase the reliability of the peripheral circuit transistor. Moreover, in the present embodiment, the oxide films 8b are formed at both end portions of the nitride film 20b. Thereby, the charge trap amount in the vicinity of the lower end portions of the gate electrode can further be reduced, and the reliability of the peripheral circuit transistor can greatly be improved.

Therefore, the present embodiment can provide a peripheral circuit transistor with excellent characteristics and reliability, wherein the progress of bird's beak oxidation can be suppressed and the charge trap amount can be reduced.

Next, the outline of the fabrication process of the semiconductor device shown in FIG. 9 is described.

To begin with, a nitride film (silicon nitride film) 20b, a gate insulation film (silicon oxide film) 20a and a nitride film (silicon nitride film) 20c are successively formed on the surface of the semiconductor substrate 1. Subsequently, a gate electrode film, which is composed of, e.g. a phosphorus-doped polysilicon film, is formed, and the gate electrode film is patterned to form a gate electrode 70.

Thereafter, an oxidizing process is performed in an atmosphere containing oxygen radicals. Thereby, electrode sidewall oxide films 8 are formed on side surfaces of the gate electrode 70. In addition, by this oxidizing process, oxide films 8a and oxide films 8b are formed. The oxygen radicals can not easily enter the silicon nitride films, but can easily enter the silicon oxide films. At this time, since the oxygen radicals and silicon oxide films react easily, the length of entrance is less than in cases of ordinary oxygen gas and water vapor, and is typically 10 nm or less. Since the oxygen radicals can transform the silicon nitride film surfaces into silicon oxide films, the silicon nitride films provided on the upper and lower sides of the region, where the oxygen radicals have entered, can easily be changed into silicon oxide films by choosing proper oxidizing process conditions. As a result, the oxide films 8a and oxide films 8b, as shown in FIG. 9, can be formed.

Figure 10:
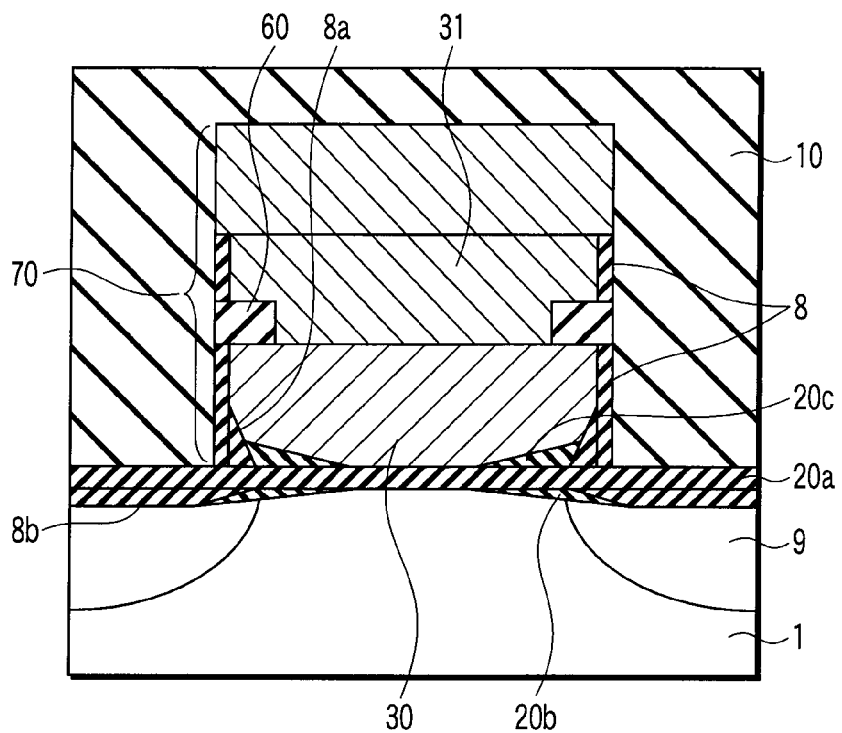
FIG. 10 is a cross-sectional view that schematically shows the structure of a semiconductor device according to a modification of the fourth embodiment of the invention.

FIG. 10 is a cross-sectional view that schematically shows the structure of a semiconductor device according to a modification of the fourth embodiment. Specifically, FIG. 10 is a cross-sectional view taken along the channel length direction of the peripheral circuit transistor of the nonvolatile memory. The basic structure is the same as shown in FIG. 9. Thus, a detailed description of the parts common to those described with reference to FIG. 9 is omitted here.

In the modification shown in FIG. 10, the nitride films 20b and 20c are formed near lower end portions of the gate electrode 70, and are not formed near a central portion of the gate electrode 70. Specifically, the nitride film 20c includes a pair of portions which are formed near lower ends of a pair of side surfaces of the gate electrode 70 (i.e. a pair of side surfaces which are parallel in the channel width direction), and the pair of portions are spaced apart. Similarly, the nitride film 20b, like the nitride film 20c, includes a pair of portions which are spaced apart.

In this modification, too, the same advantageous effects as with the peripheral circuit transistor shown in FIG. 9 can be obtained. In this modification, however, compared to the structure shown in FIG. 9, the effect of suppressing the bird's beak oxidation decreases. It is thus necessary to restrict process conditions. Instead, by virtue of the absence of the nitride film in the central region of the channel, scattering of carriers flowing in the channel hardly occurs. As a result, the mobility of carriers increases, and the on-current of the transistor can be increased. In addition, since the positive fixed charge density decreases, the threshold voltage of the transistor rises and the off-current can be decreased.

The semiconductor device shown in FIG. 10 can be fabricated by combining the fabrication method of FIG. 2 and the fabrication method of FIG. 9.

In the example shown in FIG. 10, each of the oxide films 8a and 8b has a wedge shape. Alternatively, like the example shown in FIG. 3, each of the oxide films 8a and 8b may be formed in a rectangular shape.

Embodiment 5

FIG. 11 is a cross-sectional view that schematically shows the structure of a semiconductor device according to a fifth embodiment of the invention. Specifically, FIG. 11 is a cross-sectional view taken along the channel width direction of a peripheral circuit transistor of the nonvolatile memory. The basic structure is the same as that of the fourth embodiment shown in FIG. 9. Thus, a detailed description of the parts common to those described with reference to FIG. 9 is omitted here.

As shown in FIG. 11, the peripheral circuit transistor is formed in a device formation region which is surrounded by isolation insulation films 5. The isolation insulation films 5 are buried in isolation trenches, and isolation trench sidewall insulation films 4 are formed on surfaces of the isolation trenches.

A pair of oxide films 4a and a pair of oxide films 4b are formed on inner sides of the isolation trench sidewall insulation films 4. The pair of oxide films 4a are formed between the gate insulation film 20a and gate electrode 70 and are formed near lower ends of a pair of side surfaces of the gate electrode 70 (i.e. a pair of side surfaces which are parallel in the channel length direction). Each of the oxide films 4a has a wedge shape with a width gradually increasing from an upper side toward a lower side. The pair of oxide films 4b are formed between the gate insulation film 20a and the device formation region of the semiconductor substrate 1, and are formed near upper ends of a pair of side surfaces of the device formation region (i.e. a pair of side surfaces which are parallel in the channel length direction). Each of the oxide films 4b has a wedge shape with a width gradually increasing from a lower side toward an upper side.

A nitride film 20c is formed on an upper surface of the gate insulation film 20a. The nitride film 20c is formed between the gate insulation film 20a and the gate electrode 70, and is formed between the pair of oxide films 4a. A nitride film 20b is formed on a lower surface of the gate insulation film 20a. The nitride film 20b is formed between the gate insulation film 20a and the device formation region of the semiconductor substrate 1, and is formed between the pair of oxide films 4b.

The structure shown in FIG. 11 is an example of the case in which the peripheral circuit transistor is formed at the same time as the memory cell transistor (e.g. the memory cell transistor shown in FIG. 4). Specifically, the lower-layer conductive portion 30 of the gate electrode 70 is formed in the same fabrication step as the floating gate electrode. The insulation portions 60 are formed in the same fabrication step as the inter-electrode insulation film. The upper-layer conductive portion 31 of the gate electrode 70 is formed in the same fabrication step as the control gate electrode.

The materials of the gate insulation film 20a, nitride film 20b and nitride film 20c are the same as described in the fourth embodiment. The oxide films 4a, oxide films 4b and isolation trench sidewall insulation films 4 are formed of silicon oxide films which contain silicon and oxygen as major components. Nitrogen may be contained in the silicon oxide films.

As has been described above, in the present embodiment, the nitride film 20c is formed on the upper surface of the gate insulation film 20a, and the nitride film 20b is formed on the lower surface of the gate insulation film 20a. Progress of bird's beak oxidation during the fabrication process can be prevented by the nitride films 20b and 20c. Therefore, an increase of the threshold voltage and a decrease of the transconductance of the peripheral circuit transistor can be suppressed, and degradation in characteristics of the peripheral circuit transistor can effectively be suppressed.

In addition, in the present embodiment, the oxide films 4a are formed at both end portions of the nitride film 20c. Specifically, in the vicinity of the lower end portions of the gate electrode 70, the oxide films 4a are present between the gate electrode 70 and the gate insulation film 20a, and the nitride film 20c is not present between the gate electrode 70 and the gate insulation film 20a. Thus, in the vicinity of the lower end portions of the gate electrode 70, there is no positive fixed charge or charge trap state due to the nitride film 20c. Therefore, the off-current of the peripheral circuit transistor can be reduced and malfunction can be prevented, and the reliability of the peripheral circuit transistor can greatly be improved. Moreover, in the present embodiment, the oxide films 4b are formed at both end portions of the nitride film 20b. Therefore, the positive fixed charge and the charge trap state can further be reduced, and the reliability of the peripheral circuit transistor can greatly be improved.

Therefore, the present embodiment can provide a peripheral circuit transistor with excellent characteristics and reliability, wherein the progress of bird's beak oxidation can be suppressed and the fixed charge amount can be reduced.

The semiconductor device shown in FIG. 11 can be fabricated by a method similar to the fabrication method illustrated in FIG. 4.

FIG. 12 is a cross-sectional view that schematically shows the structure of a semiconductor device according to a modification of the fifth embodiment. Specifically, FIG. 12 is a cross-sectional view taken along the channel width direction of the peripheral circuit transistor of the nonvolatile memory. The basic structure is the same as shown in FIG. 11. Thus, a detailed description of the parts common to those described with reference to FIG. 11 is omitted here.

In the modification shown in FIG. 12, the nitride films 20b and 20c are formed near lower end portions of the gate electrode 70, and are not formed near a central portion of the gate electrode 70. Specifically, the nitride film 20c includes a pair of portions which are formed near lower ends of a pair of side surfaces of the gate electrode 70 (i.e. a pair of side surfaces which are parallel in the channel length direction), and the pair of portions are spaced apart. Similarly, the nitride film 20b, like the nitride film 20c, includes a pair of portions which are spaced apart.

In this modification, too, the same advantageous effects as with the peripheral circuit transistor shown in FIG. 11 can be obtained. In this modification, however, compared to the structure shown in FIG. 11, the effect of suppressing the bird's beak oxidation decreases. It is thus necessary to restrict process conditions. Instead, by virtue of the absence of the nitride film in the central region of the channel, scattering of carriers flowing in the channel hardly occurs. As a result, the mobility of carriers increases, and the on-current can be increased.

The semiconductor device shown in FIG. 12 can be fabricated by a method similar to the fabrication method illustrated in FIG. 5.

In the example shown in FIG. 12, each of the oxide films 4a and 4b has a wedge shape. Alternatively, like the example shown in FIG. 6, each of the oxide films 4a and 4b may be formed in a rectangular shape.

Embodiment 6

Figure 13A:
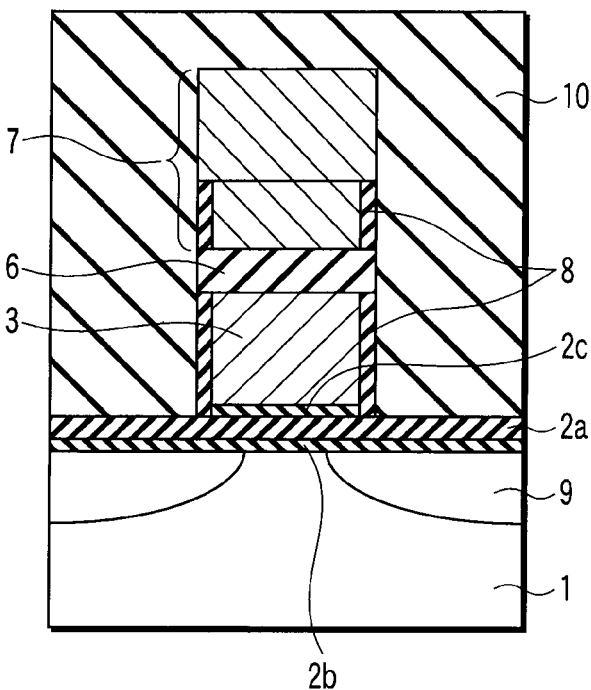
FIG. 13A and FIG. 13B are cross-sectional views that schematically show the structure of a semiconductor device according to a sixth embodiment of the present invention.
Figure 13B:
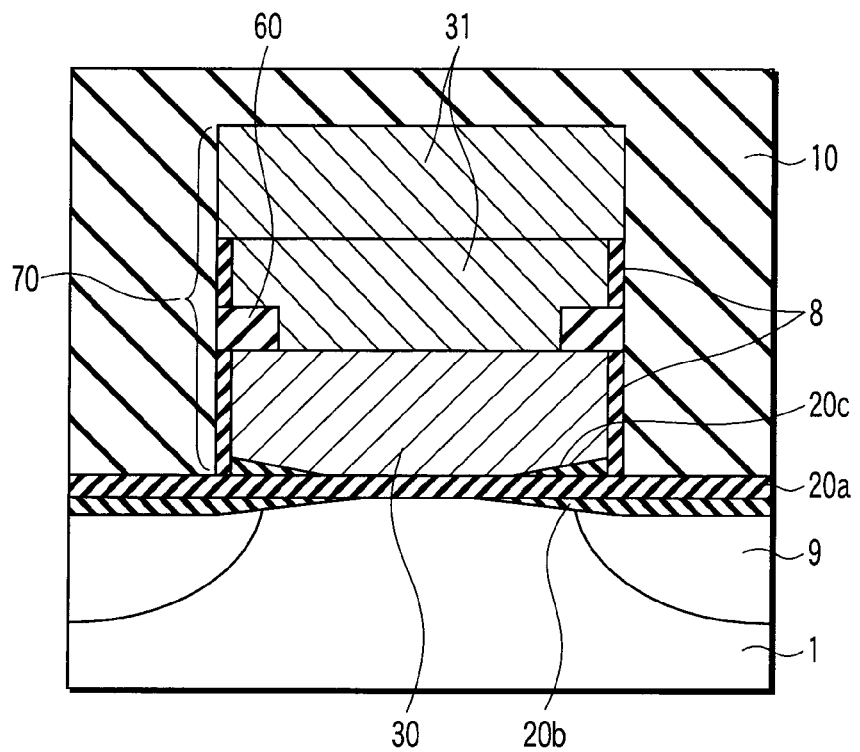

FIG. 13A and FIG. 13B are cross-sectional views which schematically show the structure of a semiconductor device according to a sixth embodiment of the invention. FIG. 13A is a cross-sectional view taken along a channel length direction of a memory cell transistor of the nonvolatile memory, and FIG. 13B is a cross-sectional view taken along a channel length direction of a peripheral circuit transistor of the nonvolatile memory. The memory cell transistor shown in FIG. 13A and the peripheral circuit transistor shown in FIG. 13B are formed on the same substrate and constitute the same nonvolatile memory. A detailed description of the parts common to those described in the preceding embodiments is omitted here. The peripheral circuit transistor in this embodiment includes select gate transistor.

The basic structure of the memory cell transistor shown in FIG. 13A is similar to that of the memory cell transistor shown in FIG. 1. However, in the memory cell transistor of this embodiment, the oxide films 8a and 8b shown in FIG. 1 are not formed.

The basic structure of the peripheral circuit transistor shown in FIG. 13B is similar to that of the peripheral circuit transistor shown in FIG. 10. However, in the peripheral circuit transistor of this embodiment, the oxide films 8a and 8b shown in FIG. 10 are not formed.

The memory cell transistor shown in FIG. 13A and the peripheral circuit transistor shown in FIG. 13B are formed at the same time by using common fabrication steps. Specifically, the lower-layer conductive portion 30 of the gate electrode 70 of the peripheral circuit transistor is formed in the same fabrication step as the floating gate electrode 3 of the memory cell transistor. The insulation portion 60 of the peripheral circuit transistor is formed in the same fabrication step as the inter-electrode insulation film 6 of the memory cell transistor. The upper-layer conductive portion 31 of the gate electrode 70 of the peripheral circuit transistor is formed in the same fabrication step as the control gate electrode 7 of the memory cell transistor.

As shown in FIG. 13A, in the memory cell transistor, the nitride film 2c is formed on the entire lower surface of the floating gate electrode 3, and the nitride film 2b is formed on the entire lower surface of the tunnel insulation film 2a. By contrast, as shown in FIG. 13B, in the peripheral circuit transistor, the nitride film 20c is formed near lower end portions of the gate electrode 70, and is not formed near a central portion of the gate electrode 70. Specifically, the nitride film 20c includes a pair of portions which are formed near lower ends of a pair of side surfaces of the gate electrode 70 (i.e. a pair of side surfaces which are parallel in the channel width direction), and the pair of portions are spaced apart. Similarly, the nitride film 20b, like the nitride film 20c, includes a pair of portions which are spaced apart.

In the present embodiment, too, since progress of bird's beak oxidation can be suppressed by the nitride films, the problem resulting from the progress of the bird's beak oxidation can be prevented. Specifically, in the memory cell transistor, an increase of a write/erase operation voltage can be suppressed, and degradation in reliability of the memory cell transistor can effectively be suppressed. Moreover, in the peripheral circuit transistor, an increase of the threshold voltage and a decrease of the transconductance can be suppressed.

In the peripheral circuit transistor, since the nitride film is not provided in the central region of the channel, scattering of carriers flowing in the channel hardly occurs. As a result, the mobility of carriers increases, and the on-current can be increased. In addition, since the fixed charge density decreases, the threshold voltage of the transistor rises and the off-current can be decreased.

In the present embodiment, therefore, the problem resulting from the progress of the bird's beak oxidation can be prevented, and the on-current can be increased and the off-current can be decreased in the peripheral circuit transistor.

FIG. 14A and FIG. 14B are cross-sectional views which schematically show the structure of a semiconductor device according to a modification of the sixth embodiment. FIG. 14A is a cross-sectional view taken along the channel length direction of the memory cell transistor of the nonvolatile memory, and FIG. 14B is a cross-sectional view taken along the channel length direction of the peripheral circuit transistor of the nonvolatile memory. The basic structure is the same as that shown in FIGS. 13A and 13B. A detailed description of the parts, which have already been described, is omitted here.

As shown in FIG. 14A, the memory cell transistor has the same structure as the memory cell transistor shown in FIG. 1. Therefore, the same advantageous effects as with the memory cell transistor shown in FIG. 1 can be obtained. As shown in FIG. 14B, the peripheral circuit transistor has the same structure as the peripheral circuit transistor shown in FIG. 10. Therefore, the same advantageous effects as with the peripheral circuit transistor shown in FIG. 10 can be obtained. In addition, since the basic structure is the same as the above-described structure shown in FIGS. 13A and 13B, the same advantageous effects as with the structure described with reference to FIG. 13A and FIG. 13B can be obtained.

Figure 15A:
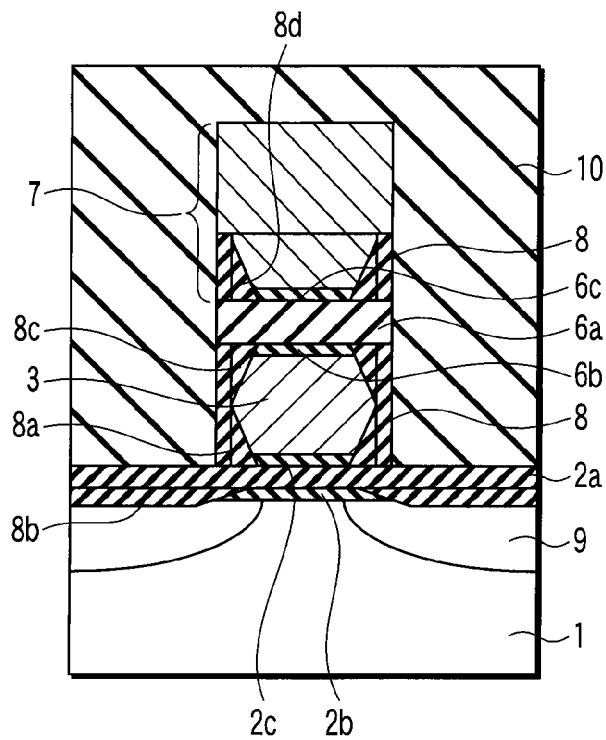
FIG. 15A and FIG. 15B are cross-sectional views that schematically show the structure of a semiconductor device according to another modification of the sixth embodiment of the invention.
Figure 15B:
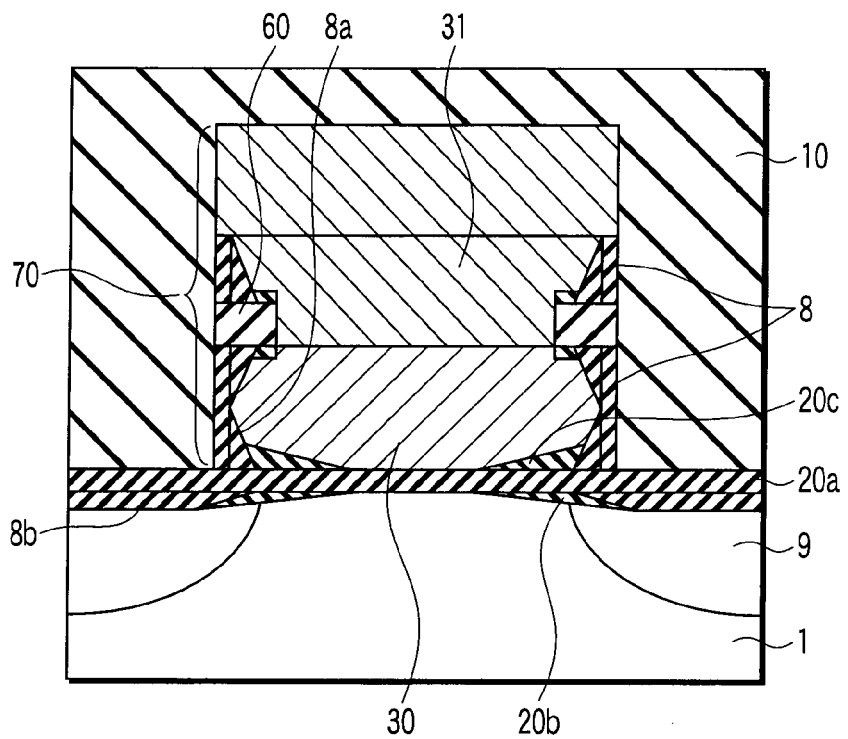

FIG. 15A and FIG. 15B are cross-sectional views which schematically show the structure of a semiconductor device according to another modification of the sixth embodiment. FIG. 15A is a cross-sectional view taken along the channel length direction of the memory cell transistor of the nonvolatile memory, and FIG. 15B is a cross-sectional view taken along the channel length direction of the peripheral circuit transistor of the nonvolatile memory. The basic structure is the same as that shown in FIGS. 13A and 13B. A detailed description of the parts, which have already been described, is omitted here.

As shown in FIG. 15A, the memory cell transistor has the same structure as the memory cell transistor shown in FIG. 7. Therefore, the same advantageous effects as with the memory cell transistor shown in FIG. 7 can be obtained. As shown in FIG. 15B, the structure of the peripheral circuit transistor is similar to the structure of the peripheral circuit transistor shown in FIG. 10. Therefore, the same advantageous effects as with the peripheral circuit transistor shown in FIG. 10 can be obtained. In addition, since the basic structure is the same as the above-described structure shown in FIGS. 13A and 13B, the same advantageous effects as with the structure described with reference to FIG. 13A and FIG. 13B can be obtained.

Embodiment 7

FIG. 16A and FIG. 16B are cross-sectional views which schematically show the structure of a semiconductor device according to a seventh embodiment of the invention. FIG. 16A is a cross-sectional view taken along the channel width direction of the memory cell transistor of the nonvolatile memory, and FIG. 16B is a cross-sectional view taken along the channel width direction of the peripheral circuit transistor of the nonvolatile memory. The memory cell transistor shown in FIG. 16A and the peripheral circuit transistor shown in FIG. 16B are formed on the same substrate and constitute the same nonvolatile memory. A detailed description of the parts, which have already been described in the preceding embodiments, is omitted here.

The basic structure of the memory cell transistor shown in FIG. 16A is similar to the structure of the memory cell transistor shown in FIG. 4. In the memory cell transistor of the present embodiment, however, the oxide films 4a and 4b shown in FIG. 4 are not formed.

The basic structure of the peripheral circuit transistor shown in FIG. 16B is similar to the structure of the peripheral circuit transistor shown in FIG. 12. In the peripheral circuit transistor of the present embodiment, however, the oxide films 4a and 4b shown in FIG. 12 are not formed.

The memory cell transistor shown in FIG. 16A and the peripheral circuit transistor shown in FIG. 16B are formed at the same time by using common fabrication steps. Specifically, the lower-layer conductive portion 30 of the gate electrode 70 of the peripheral circuit transistor is formed in the same fabrication step as the floating gate electrode 3 of the memory cell transistor. The insulation portion 60 of the peripheral circuit transistor is formed in the same fabrication step as the inter-electrode insulation film 6 of the memory cell transistor. The upper-layer conductive portion 31 of the gate electrode 70 of the peripheral circuit transistor is formed in the same fabrication step as the control gate electrode 7 of the memory cell transistor.

As shown in FIG. 16A, in the memory cell transistor, the nitride film 2c is formed on the entire lower surface of the floating gate electrode 3, and the nitride film 2b is formed on the entire lower surface of the tunnel insulation film 2a. By contrast, as shown in FIG. 16B, in the peripheral circuit transistor, the nitride film 20c is formed near lower end portions of the gate electrode 70, and is not formed near a central portion of the gate electrode 70. Specifically, the nitride film 20c includes a pair of portions which are formed near lower ends of a pair of side surfaces of the gate electrode 70 (i.e. a pair of side surfaces which are parallel in the channel length direction), and the pair of portions are spaced apart. Similarly, the nitride film 20b, like the nitride film 20c, includes a pair of portions which are spaced apart.

In the present embodiment, too, since progress of bird's beak oxidation can be suppressed by the nitride films, the problem resulting from the progress of the bird's beak oxidation can be prevented. Specifically, in the memory cell transistor, an increase of a write/erase operation voltage can be suppressed, and degradation in reliability of the memory cell transistor can effectively be suppressed. Moreover, in the peripheral circuit transistor, an increase of the threshold voltage and a decrease of the transconductance can be suppressed.

In the peripheral circuit transistor, since the nitride film is not provided in the central region of the channel, scattering of carriers flowing in the channel hardly occurs. As a result, the mobility of carriers increases, and the on-current can be increased. In addition, since the positive fixed charge density decreases, the threshold voltage of the transistor rises and the off-current can be decreased.

In the present embodiment, therefore, the problem resulting from the progress of the bird's beak oxidation can be prevented, and the on-current can be increased and the off-current can be decreased in the peripheral circuit transistor.

Figure 17A:
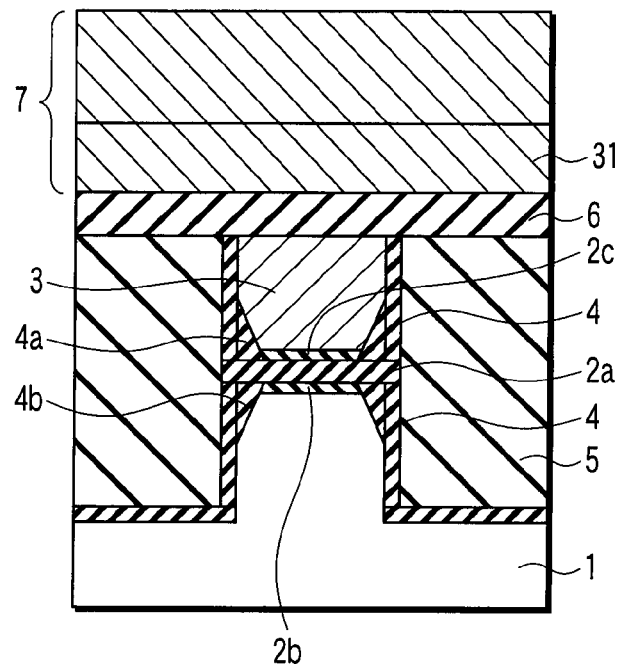
FIG. 17A and FIG. 17B are cross-sectional views that schematically show the structure of a semiconductor device according to a modification of the seventh embodiment of the invention.
Figure 17B:
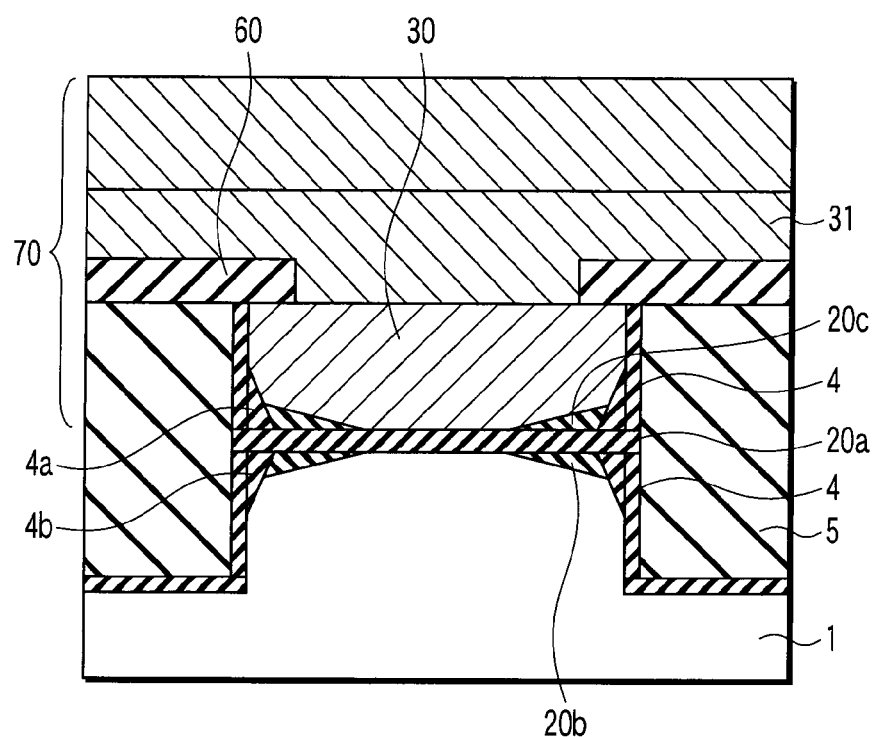

FIG. 17A and FIG. 17B are cross-sectional views which schematically show the structure of a semiconductor device according to a modification of the seventh embodiment. FIG. 17A is a cross-sectional view taken along the channel width direction of the memory cell transistor of the nonvolatile memory, and FIG. 17B is a cross-sectional view taken along the channel width direction of the peripheral circuit transistor of the nonvolatile memory. The basic structure is the same as that shown in FIGS. 16A and 16B. A detailed description of the parts, which have already been described, is omitted here.

As shown in FIG. 17A, the memory cell transistor has the same structure as the memory cell transistor shown in FIG. 4. Therefore, the same advantageous effects as with the memory cell transistor shown in FIG. 4 can be obtained. As shown in FIG. 17B, the peripheral circuit transistor has the same structure as the peripheral circuit transistor shown in FIG. 12. Therefore, the same advantageous effects as with the peripheral circuit transistor shown in FIG. 12 can be obtained. In addition, since the basic structure is the same as the above-described structure shown in FIGS. 16A and 16B, the same advantageous effects as with the structure described with reference to FIG. 16A and FIG. 16B can be obtained.

Embodiment 8

FIG. 18A and FIG. 18B through FIG. 21A and FIG. 21B are cross-sectional views which schematically illustrate a method of fabricating a semiconductor device according to an eighth embodiment of the invention. FIG. 18A to FIG. 21A are cross-sectional views taken along the channel length direction of a memory cell transistor of a nonvolatile memory, and FIG. 18B to FIG. 21B are cross-sectional views taken along the channel length direction of a peripheral circuit transistor of the nonvolatile memory. The memory cell transistor shown in FIG. 18A to 21A and the peripheral circuit transistor shown in FIG. 18B to 21B are formed on the same substrate and constitute the same nonvolatile memory. A detailed description of the parts, which have already been described in the preceding embodiments, is omitted here. The peripheral circuit transistor in this embodiment includes select gate transistor.

Figure 18A:
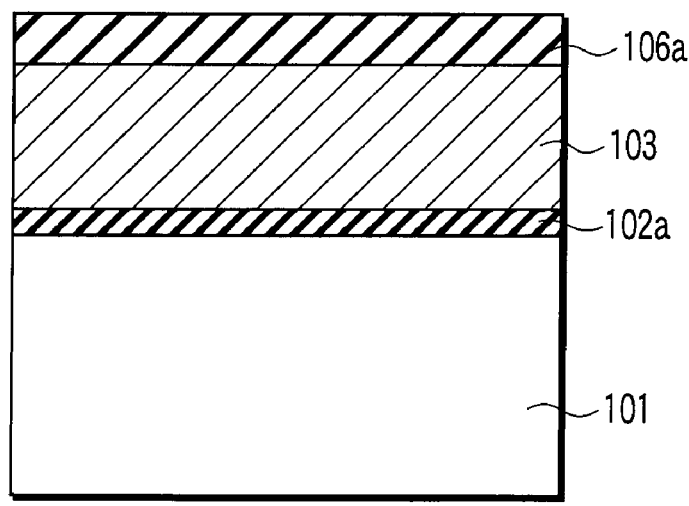
FIG. 18A and FIG. 18B are cross-sectional views that schematically show a fabrication step of a semiconductor device according to an eighth embodiment of the present invention.
Figure 18B:
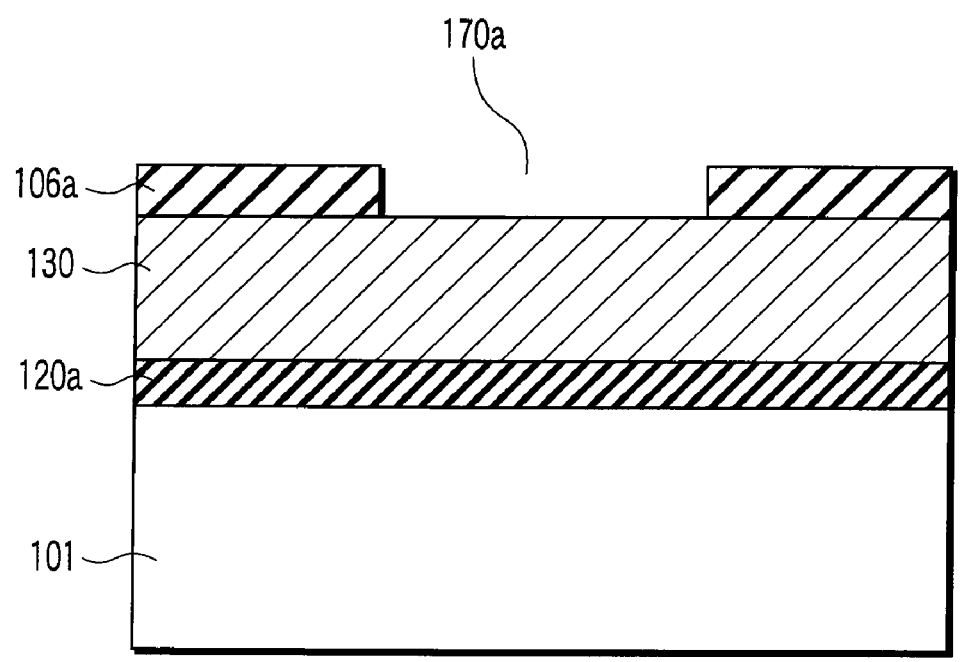

To begin with, as shown in FIG. 18A and FIG. 18B, a silicon oxide film 102a, which becomes a tunnel insulation film, and a silicon oxide film 120a, which becomes a gate insulation film, are formed on the surface of a silicon substrate (semiconductor substrate) 101 by, for example, thermal oxidation. The silicon oxide films 102a and 120a may be formed at the same time with the same film kind and the same film thickness, or may be formed independently with different film kinds and different film thicknesses. Subsequently, a silicon film 103 such as a phosphorus-doped polysilicon film, which becomes a floating gate electrode, and a silicon film 130 such as a phosphorus-doped polysilicon film, which becomes a lower-layer conductive portion of a gate electrode, are formed by, for example, CVD (chemical vapor deposition). The silicon films 103 and 130 may be formed at the same time with the same film thickness, or may be formed independently with different film thicknesses. Further, a stack insulation film 106a, which is composed of a silicon oxide film/silicon nitride film/silicon oxide film, is formed by, e.g. CVD. Using a photoresist (not shown) as a mask, the stack insulation film 106a is partly etched away, and an opening portion 170a is formed.

In a subsequent step, as shown in FIG. 19A and FIG. 19B, a silicon film 107 is formed by, e.g. CVD. Then, using, for example, a photoresist (not shown) as a mask, the silicon film 107, stack insulation film 106a, silicon films 103 and 130 are partly etched away. Thereby, a floating gate electrode 103 and a control gate electrode 107 of the memory cell transistor and a gate electrode 170 of the peripheral circuit transistor are formed. The gate length L1 of the memory cell transistor is typically set at about 50 nm or less. On the other hand, the gate length L2 of the peripheral circuit transistor is set to be greater than L1. L2 is typically set at 1.2 or more times greater than L1, and preferably at twice or more greater than L1.

Figure 20A:
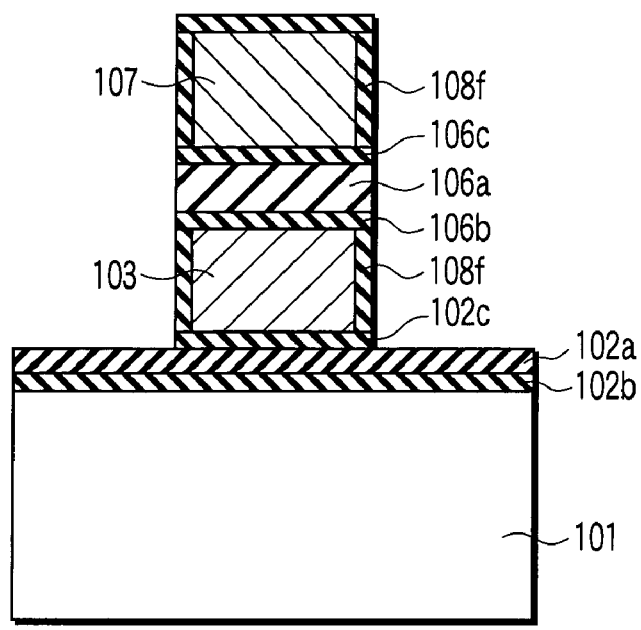
FIG. 20A and FIG. 20B are cross-sectional views that schematically show a fabrication step of the semiconductor device according to the eighth embodiment of the invention.
Figure 20B:
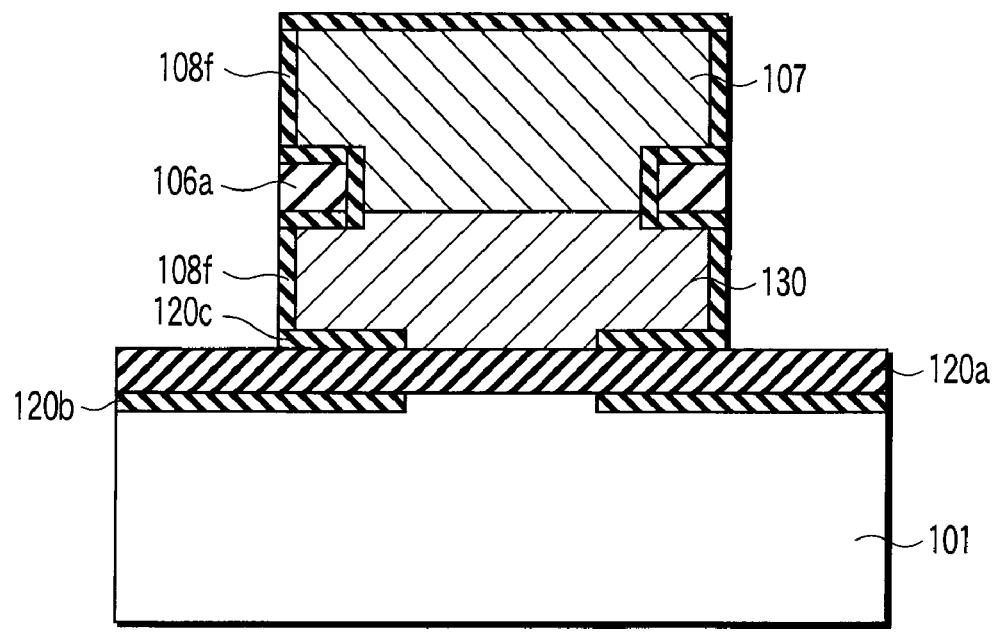

Thereafter, as shown in FIG. 20A and FIG. 20B, a thermal nitriding process is performed in an atmosphere containing nitric oxide gas as a nitriding agent at high temperatures of about 700° C. to about 1000° C. The temperature and time of the thermal nitriding process are so set that the diffusion length of the nitric oxide gas in silicon oxide films may become greater than half the length L1 and less than half the length L2. Thereby, silicon nitride films 108f are formed on exposed surfaces of the silicon films 103, 130 and 107. In addition, silicon nitride films 102c and 102b are formed on upper and lower surfaces of the silicon oxide film 102a. In addition, silicon nitride films 106c and 106b are formed on upper and lower surfaces of the stack insulation film 106a. Furthermore, silicon nitride films 120c and 120b are formed on upper and lower surfaces of the silicon oxide film 120a. The silicon nitride films 120c and 120b, however, are formed near end portions of the channel region, and are not formed in a central portion of the channel region.

Next, as shown in FIG. 21A and FIG. 21B, a radical oxidizing process is performed in an atmosphere containing oxygen radicals as an oxidizing agent. Thereby, the silicon nitride films 108f, which are formed on the exposed surfaces of the silicon films 103, 130 and 107 are transformed into silicon oxide films 108.

Figure 22:
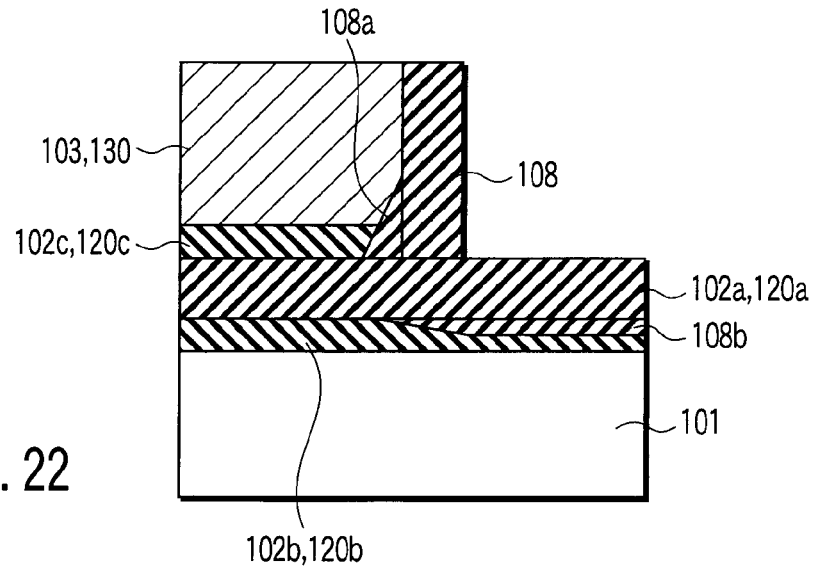
FIG. 22 is a view relating to the fabrication method of the semiconductor device according to the eighth embodiment of the invention, and shows a part of the structure in enlarged scale.

FIG. 22 is an enlarged view showing the vicinity of the tunnel insulation film 102a of the memory cell transistor or the vicinity of the gate insulation film 120a of the peripheral circuit transistor, which has been subjected to the radical oxidizing process.

At the time of the radical oxidizing process, the oxygen radicals are diffused into the silicon oxide films 102a, 120a and 108. Hence, the lower end portions of the floating gate electrode 103 and the lower end portions of the gate electrode 130 are oxidized, and silicon oxide films 108a are formed in a bird's beak shape. In addition, the surfaces of the silicon nitride films 102b and 120b are oxidized, and silicon oxide films 108b are formed.

Figure 23:
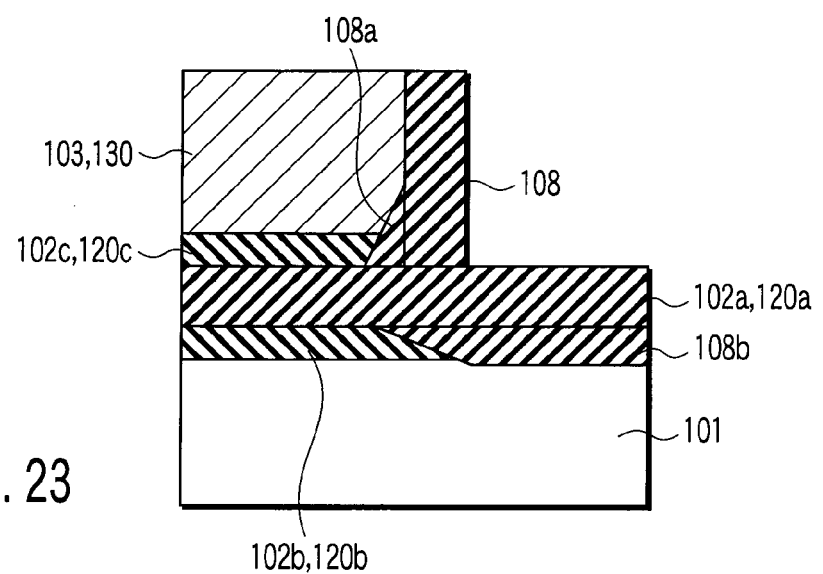
FIG. 23 is a view relating to the fabrication method of the semiconductor device according to the eighth embodiment of the invention, and shows a part of the structure in enlarged scale.

As shown in FIG. 23, by adjusting the diffusion length of oxygen radicals, the silicon nitride films 102b and 120b over the entire thickness thereof may also be transformed into silicon oxide film 108b.

Figure 24:
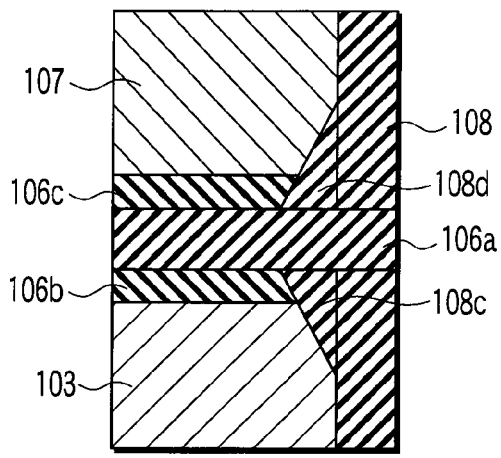
FIG. 24 is a view relating to the fabrication method of the semiconductor device according to the eighth embodiment of the invention, and shows a part of the structure in enlarged scale.

FIG. 24 is an enlarged view showing the vicinity of the inter-electrode insulation film 106a of the memory cell transistor, which has been subjected to the radical oxidizing process. At the time of the radical oxidizing process, the oxygen radicals are diffused into the silicon oxide films 106a and 108. Hence, the upper end portions of the floating gate electrode 103 and the lower end portions of the control gate electrode 107 are oxidized, and silicon oxide films 108c and 108d are formed in a bird's beak shape.

Although subsequent fabrication steps are not shown, impurity diffusion layers (not shown) are formed by, for example, an ion implantation method. Thereafter, an inter-layer insulation film (not shown) is formed by, e.g. CVD, and wiring lines, etc. are formed by well-known methods.

In the fabrication method of the present embodiment, the memory cell transistor structure with the gate length L1 and the peripheral circuit transistor structure with the gate length L2 that is greater than L1 are formed. The nitride films 102b, 102c, 106b, 106c, 120b and 120c are formed at the same time under the thermal nitriding condition that the diffusion length of the nitriding agent in the tunnel insulation film and gate insulation film may become greater than half the length L1 and less than half the length L2. Thereby, the nonvolatile memory as shown in the sixth embodiment can easily be fabricated with a small number of fabrication steps.

In the case where the nitride films are formed by using the thermal nitriding process as in the present embodiment, the nitride films are formed on the sidewall regions of the floating gate electrode 103, control gate electrode 107 and gate electrode 170. Since the nitride films at the sidewall regions increase the charge trap amount and positive fixed charge amount at the end portions of the electrodes, degradation in reliability or malfunction may occur. In addition, the dielectric constant of the nitride film is higher than that of the oxide film. As a result, the nitride film increases the parasitic capacitance between the gate electrode and the impurity diffusion layer or the parasitic capacitance between neighboring transistors, leading to a decrease in operation speed or malfunction. In the present embodiment, the oxygen radical oxidation is performed after the nitride films 102b, 102c, 106b, 106c, 120b and 120c are formed. Thereby, the nitride films 108f, which are formed on the sidewalls of the floating gate electrode 103, control gate electrode 107 and gate electrode 170, are transformed into the oxide films 108. Thus, the above-described degradation in reliability and the transistor malfunction can be avoided.

The tunnel insulation film 102a, gate insulation film 120a and inter-electrode insulation film 106a are not limited to silicon oxide films. Other kinds of insulation materials, in which a nitriding agent can easily be diffused, are usable. For example, a silicon oxide film containing nitrogen is usable. A high dielectric constant oxide film, such as an alumina film or a hafnia film, is usable. The nitriding agent is not limited to nitric oxygen gas. Other kinds of nitriding agents, which diffuse into insulative materials and form nitride films on surfaces of the substrate and electrodes, are usable. For example, nitrous oxide gas, ammonia gas or nitrogen radicals are usable. The method of forming nitride films is not limited to the thermal nitridation.

Oxidizing species for transforming the nitride films, which are formed on the sidewalls of the gate electrode, into oxide films, are not limited to oxygen radicals. Other kinds of oxidizing species, which enter insulative materials within small length, are usable. For example, excited-state or ground-state oxygen atoms, excited-state or ground-state hydroxyls (OH), excited-state oxygen molecules, excited-state water molecules and ozone molecules are usable. Electrically neutral oxidizing species and charged oxidizing species are also usable.

As regards the method of generating oxygen radicals, a mixture gas of oxygen and argon may be subjected to microwave discharge, and radical oxidizing species, such as excited-state oxygen molecules and oxygen atoms, may be generated, or some other oxygen-containing gas and inert gas may be combined. Besides, hydroxyls may be generated by mixing with hydrogen-containing gas such as hydrogen gas. Moreover, radical oxidizing species may be generated by other plasma methods such as radio-frequency (RF) discharge. Oxygen gas and hydrogen gas may be introduced into a reaction furnace and caused to thermally react, thereby generating radical oxidizing species such as hydroxyls. Furthermore, like a remote plasma method or an ozone oxidizing method, a place where radical oxidizing species are generated may be different from a place where a silicon substrate is subjected to a radical oxidizing process.

Embodiment 9

FIG. 25A and FIG. 25B through FIG. 27A and FIG. 27B are cross-sectional views which schematically illustrate a method of fabricating a semiconductor device according to a ninth embodiment of the invention. FIG. 25A to FIG. 27A are cross-sectional views taken along the channel width direction of a memory cell transistor of a nonvolatile memory, and FIG. 25B to FIG. 27B are cross-sectional views taken along the channel width direction of a peripheral circuit transistor of the nonvolatile memory. The memory cell transistor shown in FIG. 25A to 27A and the peripheral circuit transistor shown in FIG. 25B to 27B are formed on the same substrate and constitute the same nonvolatile memory. A detailed description of the parts, which have already been described in the preceding embodiments, is omitted here.

Figure 25A:
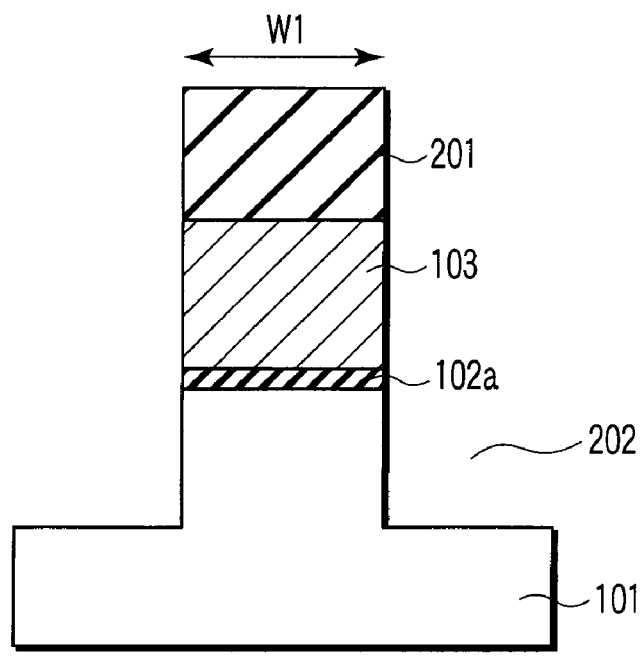
FIG. 25A and FIG. 25B are cross-sectional views that schematically show a fabrication step of a semiconductor device according to a ninth embodiment of the present invention.
Figure 25B:
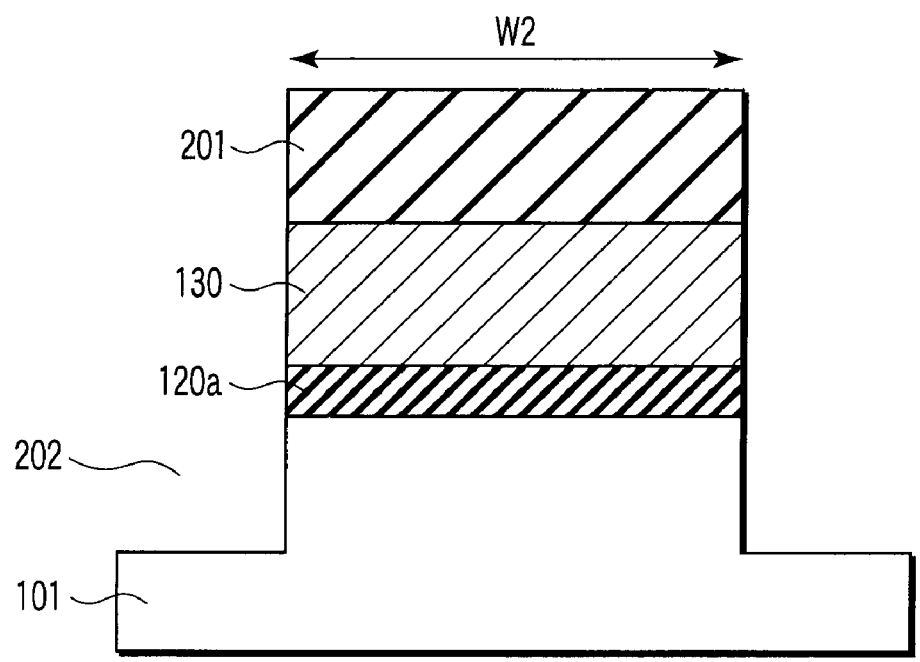

To begin with, as shown in FIG. 25A and FIG. 25B, a silicon oxide film 102a, which becomes a tunnel insulation film, and a silicon oxide film 120a, which becomes a gate insulation film, are formed on the surface of a silicon substrate 101 by, for example, thermal oxidation. The silicon oxide films 102a and 120a may be formed at the same time with the same film kind and the same film thickness, or may be formed independently with different film kinds and different film thicknesses. Subsequently, a silicon film 103 such as a phosphorus-doped polysilicon film, which becomes a floating gate electrode, and a silicon film 130 such as a phosphorus-doped polysilicon film, which becomes a lower-layer conductive portion of a gate electrode, are formed by, for example, CVD. The silicon films 103 and 130 may be formed at the same time with the same film thickness, or may be formed independently with different film thicknesses.

Subsequently, a silicon nitride film, which becomes an etching mask 201, is formed by, e.g. CVD. Then, using, for example, a photoresist (not shown) as a mask, the silicon nitride film 201, silicon films 103 and 130 and silicon oxide films 102a and 120a are partly etched away. Further, exposed portions of the silicon substrate 101 are etched away, and isolation trenches 202 are formed. The gate width W1 of the memory cell transistor is typically set at about 50 nm or less. On the other hand, the gate width W2 of the peripheral circuit transistor is set to be greater than W1. W2 is typically set at 1.2 or more times greater than W1, and preferably at twice or more greater than W1.

Thereafter, as shown in FIG. 26A and FIG. 26B, a thermal nitriding process is performed in an atmosphere containing nitric oxide gas as a nitriding agent at high temperatures of about 700° C. to about 1000° C. The temperature and time of the thermal nitriding process are so set that the diffusion length of the nitric oxide gas in silicon oxide films may become greater than half the width W1 and less than half the width W2. Thereby, silicon nitride films 104f are formed on exposed surfaces of the silicon films 103 and 130 and on exposed surfaces of the silicon substrate 101. In addition, silicon nitride films 102c and 102b are formed on upper and lower surfaces of the silicon oxide film 102a. In addition, silicon nitride films 120c and 120b are formed on upper and lower surfaces of the silicon oxide film 120a. The silicon nitride films 120c and 120b, however, are formed near end portions of the channel region, and are not formed in a central portion of the channel region.

Figure 27A:
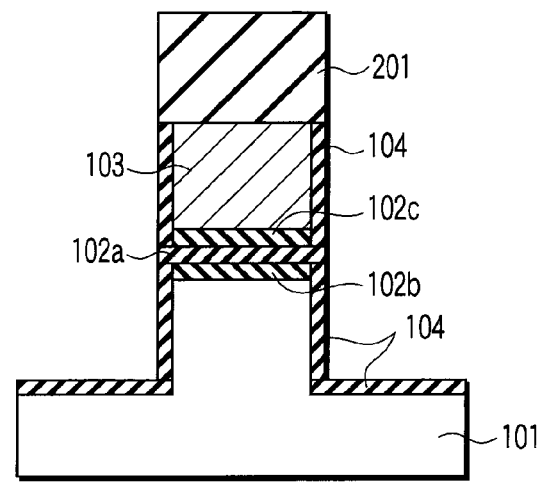
FIG. 27A and FIG. 27B are cross-sectional views that schematically show a fabrication step of the semiconductor device according to the ninth embodiment of the invention.
Figure 27B:
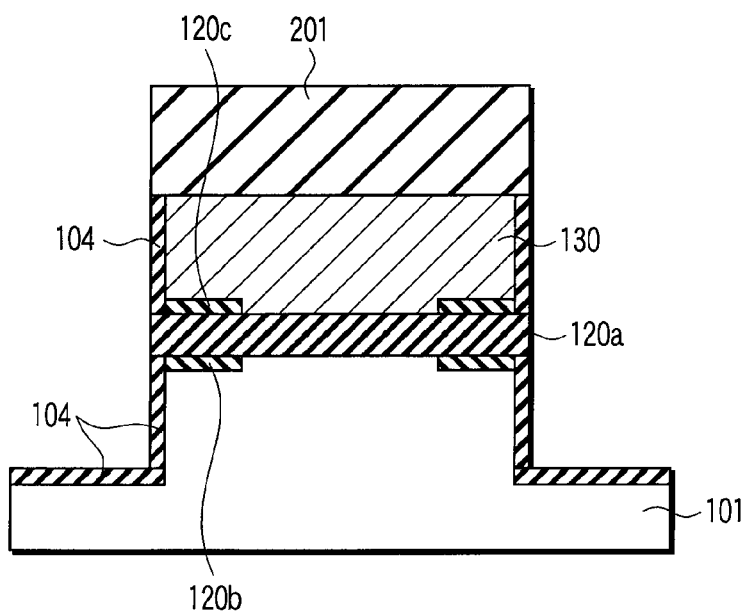

Next, as shown in FIG. 27A and FIG. 27B, a radical oxidizing process is performed in an atmosphere containing oxygen radicals as an oxidizing agent. Thereby, the silicon nitride films 104f, which are formed on the exposed surfaces of the silicon films 103 and 130 and on the exposed surfaces of the silicon substrate 101, are transformed into silicon oxide films 104.

Figure 28:
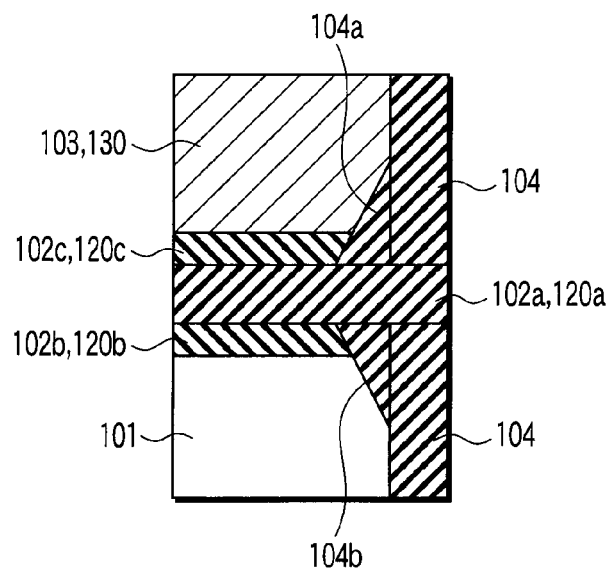
FIG. 28 is a view relating to the fabrication method of the semiconductor device according to the ninth embodiment of the invention, and shows a part of the structure in enlarged scale.

FIG. 28 is an enlarged view showing the vicinity of the tunnel insulation film 102a of the memory cell transistor or the vicinity of the gate insulation film 120a of the peripheral circuit transistor, which has been subjected to the radical oxidizing process.

At the time of the radical oxidizing process, the oxygen radicals are diffused into the silicon oxide films 102a, 120a and 104. Hence, the lower end portions of the floating gate electrode 103, the lower end portions of the gate electrode 130 and the upper end portions of the silicon substrate 101 are oxidized, and silicon oxide films 104a and 104b are formed in a bird's beak shape.

Although subsequent fabrication steps are not shown, isolation insulation films (not shown) are buried in the isolation trenches 202, for example, by a coating method. Further, surface planarization is performed, for example, by CMP (Chemical Mechanical Polishing), and upper surfaces of the silicon films 103 and 130 are exposed. Subsequently, the method of the eighth embodiment, for instance, is carried out, and the memory cell transistor and the peripheral circuit transistor are completely fabricated.

In the fabrication method of the present embodiment, the memory cell transistor structure with the gate width W1 and the peripheral circuit transistor structure with the gate width W2 that is greater than W1 are formed. The nitride films 102b, 102c, 120b and 120c are formed at the same time under the thermal nitriding condition that the diffusion length of the nitriding agent in the tunnel insulation film and gate insulation film may become greater than half the width W1 and less than half the width W2. Thereby, the nonvolatile memory as shown in the seventh embodiment can easily be fabricated with a small number of fabrication steps.

In the case where the nitride films are formed by using the thermal nitriding process as in the present embodiment, the nitride films 104f are formed in the sidewall regions of the floating gate electrode 103 and the lower-layer conductive portion 130 of the gate electrode, and on the side surfaces and bottom surfaces of the silicon substrate 101. Since the nitride films in the sidewall regions increase the fixed charge amount, malfunction of the transistor may occur. In addition, the dielectric constant of the nitride film is higher than that of the oxide film. As a result, the nitride film increases the parasitic capacitance between neighboring transistors, leading to a decrease in operation speed or malfunction. In the present embodiment, the oxygen radical oxidation is performed after the nitride films 102b, 102c, 120b and 120c are formed. Thereby, the nitride films 104f are transformed into the oxide films 104. Thus, the above-described problem, such as malfunction of the transistor, can be avoided.

The tunnel insulation film 102a and gate insulation film 120a are not limited to silicon oxide films. Other kinds of insulation materials, in which a nitriding agent can easily be diffused, are usable. For example, a silicon oxide film containing nitrogen is usable. A high dielectric constant oxide film, such as an alumina film or a hafnia film, is usable. The nitriding agent is not limited to nitric oxygen gas. Other kinds of nitriding agents, which diffuse into insulative materials and form nitride films on surfaces of the substrate and electrodes, are usable. For example, nitrous oxide gas, ammonia gas or nitrogen radicals are usable. The method of forming nitride films is not limited to the thermal nitridation.

As regards the radical oxidation process for transforming the nitride films into oxide films, the method, which has been described in the eighth embodiment, is applicable.

In the above-described first to ninth embodiments, silicon (Si) is used as the material of the semiconductor substrate and electrodes (floating gate electrode, control gate electrode and gate electrode). Alternatively, silicon germanium (SiGe), etc. may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a tunnel insulation film formed on a semiconductor substrate;
a floating gate electrode formed on the tunnel insulation film;
an inter-electrode insulation film formed on the floating gate electrode;
a control gate electrode formed on the inter-electrode insulation film;
a pair of oxide films which are formed between the tunnel insulation film and the floating gate electrode and are formed near lower end portions of a pair of side surfaces of the floating gate electrode, which are parallel in one of a channel width direction and a channel length direction; and
a nitride film which is formed between the tunnel insulation film and the floating gate electrode and is sandwiched between the pair of oxide films, the nitride film having side surfaces which are in contact with the pair of oxide films.

2. The device according to claim 1, wherein the pair of oxide films are formed near lower end portions of a pair of side surfaces of the floating gate electrode, which are parallel in the channel width direction, and
each of the pair of oxide films has a width in the channel length direction, which increases from an upper side toward a lower side.

3. The device according to claim 1, wherein the pair of oxide films are formed near lower end portions of a pair of side surfaces of the floating gate electrode, which are parallel in the channel width direction, and
the nitride film includes a pair of portions which are formed near lower end portions of a pair of side surfaces of the floating gate electrode, which are parallel in the channel width direction, the pair of portions being spaced apart from each other.

4. The device according to claim 1, wherein the pair of oxide films are formed near lower end portions of a pair of side surfaces of the floating gate electrode, which are parallel in the channel length direction, and
each of the pair of oxide films has a width in the channel width direction, which increases from an upper side toward a lower side.

5. The device according to claim 1, wherein the pair of oxide films are formed near lower end portions of a pair of side surfaces of the floating gate electrode, which are parallel in the channel length direction, and
the nitride film includes a pair of portions which are formed near lower end portions of a pair of side surfaces of the floating gate electrode, which are parallel in the channel length direction, the pair of portions being spaced apart from each other.

6. A semiconductor device comprising:
a tunnel insulation film formed on a semiconductor substrate;
a floating gate electrode formed on the tunnel insulation film;
an inter-electrode insulation film formed on the floating gate electrode;
a control gate electrode formed on the inter-electrode insulation film;
a pair of first oxide films which are formed between the floating gate electrode and the inter-electrode insulation film and are formed near upper end portions of a pair of side surfaces of the floating gate electrode, which are parallel in a channel width direction;
a first nitride film which is formed between the floating gate electrode and the inter-electrode insulation film and is sandwiched between the pair of first oxide films, the first nitride film having side surfaces which are in contact with the pair of first oxide films;

a pair of second oxide films which are formed between the inter-electrode insulation film and the control gate electrode and are formed near lower end portions of a pair of side surfaces of the control gate electrode, which are parallel in a channel width direction; and a second nitride film which is formed between the inter-electrode insulation film and the control gate electrode and is sandwiched between the pair of second oxide films, the second nitride film having side surfaces which are in contact with the pair of second oxide films.

7. The device according to claim 6, wherein each of the pair of first oxide films has a width in the channel length direction, which increases from a lower side toward an upper side, and each of the pair of second oxide films has a width in the channel length direction, which increases from an upper side toward a lower side.

8. The device according to claim 6, wherein the first nitride film includes a pair of first portions which are formed near upper end portions of a pair of side surfaces of the floating gate electrode, which are parallel in the channel width direction, the pair of first portions being spaced apart from each other, and vthe second nitride film includes a pair of second portions which are formed near lower end portions of a pair of side surfaces of the control gate electrode, which are parallel in the channel width direction, the pair of second portions being spaced apart from each other.

9. A semiconductor device comprising:

a gate insulation film formed on a semiconductor substrate;

a gate electrode formed on the gate insulation film;

a pair of oxide films which are formed between the gate insulation film and the gate electrode and are formed near lower end portions of a pair of side surfaces of the gate electrode, which are parallel in one of a channel width direction and a channel length direction; and a nitride film which is formed between the gate insulation film and the gate electrode and is sandwiched between the pair of oxide films, the nitride film having side surfaces which are in contact with the pair of oxide films.

10. The device according to claim 9, wherein the pair of oxide films are formed near lower end portions of a pair of side surfaces of the gate electrode, which are parallel in the channel width direction, and each of the pair of oxide films has a width in the channel length direction, which increases from an upper side toward a lower side.

11. The device according to claim 9, wherein the pair of oxide films are formed near lower end portions of a pair of side surfaces of the gate electrode, which are parallel in the channel width direction, and the nitride film includes a pair of portions which are formed near lower end portions of a pair of side surfaces of the gate electrode, which are parallel in the channel width direction, the pair of portions being spaced apart from each other.

12. The device according to claim 9, wherein the pair of oxide films are formed near lower end portions of a pair of side surfaces of the gate electrode, which are parallel in the channel length direction, and each of the pair of oxide films has a width in the channel width direction, which increases from an upper side toward a lower side.

13. The device according to claim 9, wherein the pair of oxide films are formed near lower end portions of a pair of side surfaces of the gate electrode, which are parallel in the channel length direction, and the nitride film includes a pair of portions which are formed near lower end portions of a pair of side surfaces of the gate electrode, which are parallel in the channel length direction, the pair of portions being spaced apart from each other.

* * * * *

UNITED STATES PATENT AND TRADEMARK OFFICE
CERTIFICATE OF CORRECTION

| | | |
|---|---|---|
| PATENT NO. | : 7,800,160 B2 | |
| APPLICATION NO. | : 11/937024 | |
| DATED | : September 21, 2010 | |
| INVENTOR(S) | : Ozawa | |

It is certified that error appears in the above-identified patent and that said Letters Patent is hereby corrected as shown below:

Claim 8, column 27, line 22, after "other, and" insert a paragraph break.

Claim 8, column 27, line 22, change "vthe" to --the--.

Signed and Sealed this

Thirtieth Day of November, 2010

David J. Kappos
*Director of the United States Patent and Trademark Office*